(12) United States Patent
Ishii et al.

(10) Patent No.: US 6,905,261 B2
(45) Date of Patent: Jun. 14, 2005

(54) OPTICAL FIBER MODULE LEAD FRAME AND OPTICAL FIBER MODULE

(75) Inventors: Sonomi Ishii, Tokyo (JP); Takehiko Nomura, Tokyo (JP); Masayuki Iwase, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 246 days.

(21) Appl. No.: 10/100,283

(22) Filed: Mar. 15, 2002

(65) Prior Publication Data

US 2002/0159721 A1 Oct. 31, 2002

(30) Foreign Application Priority Data

Mar. 29, 2001 (JP) .................................. 2001-096530
Mar. 29, 2001 (JP) .................................. 2001-096531
Mar. 29, 2001 (JP) .................................. 2001-096532

(51) Int. Cl.[7] .............................................. G02B 6/36
(52) U.S. Cl. ............................................... 385/92; 385/88
(58) Field of Search ............................ 385/88, 89, 92, 385/94, 14, 139; 398/67, 72

(56) References Cited

U.S. PATENT DOCUMENTS

| | | | |
|---|---|---|---|
| 5,047,835 A | 9/1991 | Chang | |
| 5,233,208 A | 8/1993 | Thillays | |
| 5,432,630 A | * 7/1995 | Lebby et al. | ................ 398/116 |
| 5,506,445 A | 4/1996 | Rosenberg | |
| 6,213,651 B1 | * 4/2001 | Jiang et al. | .................... 385/92 |

OTHER PUBLICATIONS

Cheng, David K., *Field and Wave Electromagnetics*, Addison–Wesley Publishing Company, Taiwan, pp. 83, (1983).

* cited by examiner

Primary Examiner—Diane I. Lee
Assistant Examiner—Lisa M. Caputo
(74) Attorney, Agent, or Firm—Knobbe Martens Olson & Bear LLP

(57) ABSTRACT

An optical fiber module lead frame has a plurality of lead terminals. One of the plurality of lead terminals functions as a lead terminal for inputting transmit signals for feeding electricity to a light emitting device from outside. One of the other lead terminals functions as a lead terminal for outputting received signals for sending electrical signals outputted from a photodetector to outside. An electric field between the lead terminal for inputting transmit signals and the lead terminal for outputting received signals is one source of crosstalk from the light emitting device side to the photodetector side. Then, provided is the configuration of suppressing the electric field between the lead terminal for inputting transmit signals and the lead terminal for outputting received signals.

10 Claims, 19 Drawing Sheets

OPTICAL FIBER MODULE LEAD FRAME AND OPTICAL FIBER MODULE

FIELD OF THE INVENTION

The present invention relates to an optical fiber module mounted with a light emitting device and a photodetector, and to a lead frame configuring the same.

BACKGROUND OF THE INVENTION

For example, in optical communication systems having a function of two-way communications, an optical fiber module having a light emitting device and a photodetector incorporated thereinto is used. With the development of recent computer hardware or information communication networks, such the optical fiber module has been installed even in home. Accordingly, demand for downsizing and cost saving has been increased on the optical fiber module.

SUMMARY OF THE INVENTION

In one aspect, the invention is to provide the following optical fiber module lead frame.

More specifically, the optical fiber module lead frame comprises:

a lead terminal for inputting transmit signals for sending electrical signals to a light emitting device; and a lead terminal for outputting received signals for receiving electrical signals from a photodetector, wherein the lead terminal for inputting transmit signals and the lead terminal for outputting received signals are disposed so that tip ends are not faced each other.

Additionally, in another aspect, the invention is to provide the following optical fiber module lead frame.

That is, the optical fiber module lead frame comprises:

a lead terminal for inputting transmit signals for sending electrical signals to a light emitting device;

a lead terminal for outputting received signals for receiving electrical signals from a photodetector; and a ground lead terminal disposed adjacent to one of the lead terminal for inputting transmit signals and the lead terminal for outputting received signals, wherein the ground lead terminal has a portion lying between tip end parts of the lead terminal for inputting transmit signals and the lead terminal for outputting received signals.

Furthermore, in still another aspect, the invention is to provide the following optical fiber module lead frame.

More specifically, the optical fiber module lead frame comprises:

a lead terminal for inputting transmit signals for sending electrical signals to a light emitting device;

a lead terminal for outputting received signals for receiving electrical signals from a photodetector; and a ground lead terminal disposed adjacent to one of the lead terminal for inputting transmit signals and the lead terminal for outputting received signals, wherein the lead terminal for inputting transmit signals and the lead terminal for outputting received signals are disposed so as not to be adjacently disposed, and any one of the lead terminal for inputting transmit signals, the lead terminal for outputting received signals and the ground terminal is formed to extend in the direction close to a lead terminal adjacent thereto.

BRIEF DESCRIPTION OF THE DRAWINGS

Exemplary embodiments of the invention will now be described in conjunction with drawings in which.

DETAILED DESCRIPTION

Figure 22A:
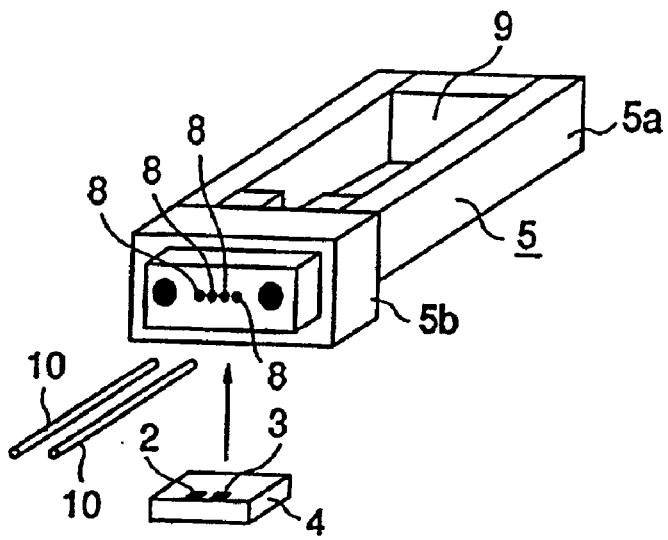
FIG. 22A depicts a model diagram showing one exemplary form of a package, a device mounting substrate, a light emitting device and a photodetector, which configure the optical fiber module.
Figure 22B:
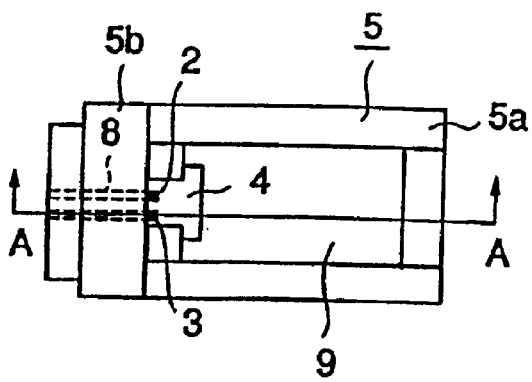
FIGS. 22B and 22C depict diagrams for illustrating an exemplary form of connecting the package, the device mounting substrate, the light emitting device and the photodetector.
Figure 22D:
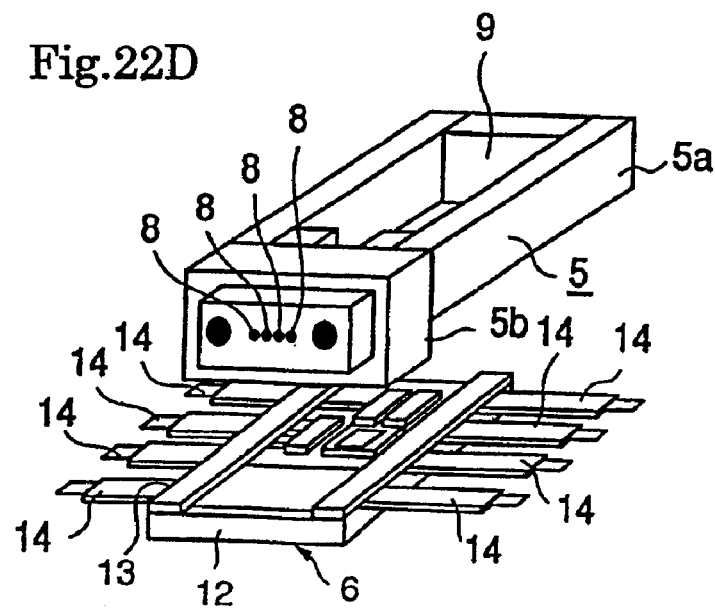
FIG. 22D depicts a model diagram showing one example of the lead frame configuring the optical fiber module along with the package.
Figures 23A, 23B:
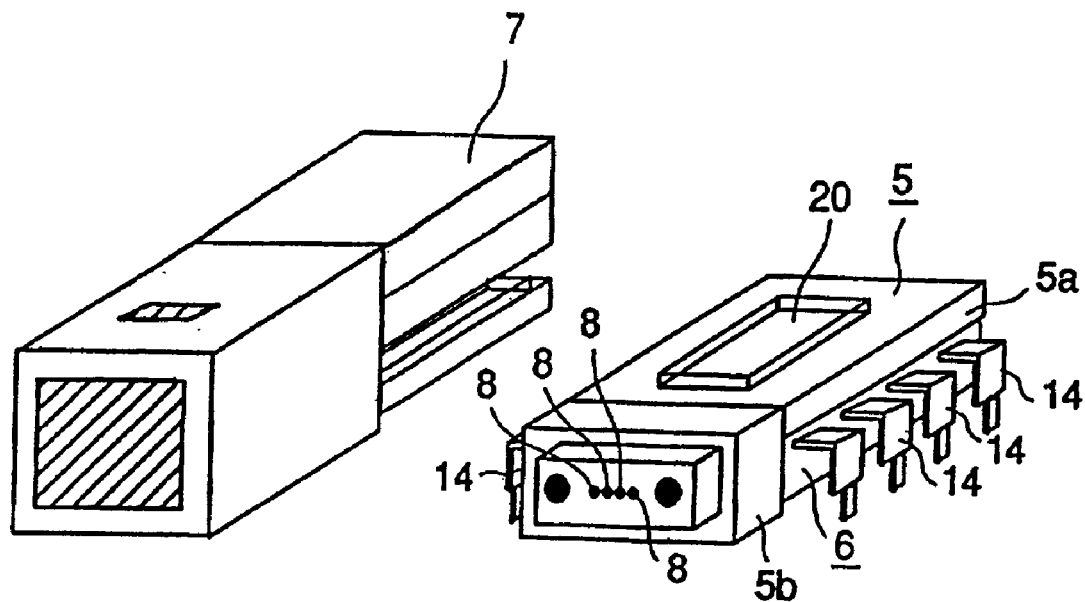
FIG. 23A depicts a model diagram showing one example of an adaptor configuring the optical fiber module.
FIG. 23B depicts a model diagram showing an exemplary form in a state that the package, the device mounting substrate, the light emitting device and the photodetector and the lead frame are incorporated.
Figure 23C:
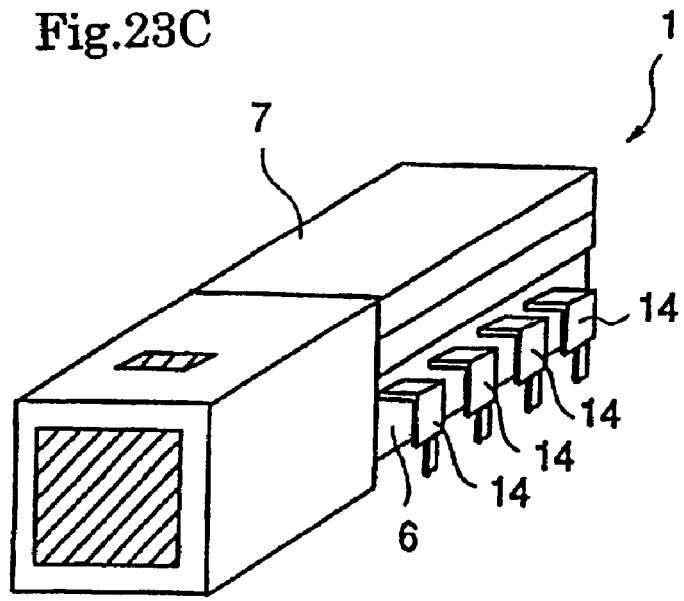
FIG. 23C depicts a model diagram showing an exemplary appearance of the optical fiber module.

In order to respond to the demand for downsizing and cost saving, the assignee has proposed the following optical fiber module. FIG. 23C depicts a schematic perspective view illustrating one exemplary appearance of the proposed optical fiber module. An optical fiber module 1 of this proposal has a light emitting device 2, a photodetector 3, a device mounting substrate 4, a package 5 as shown in FIG. 22A, a lead frame 6 as shown in FIG. 22D, and an adapter 7 as shown in FIG. 23A. These components 2 to 7 are incorporated to form the optical fiber module 1.

The device mounting substrate 4 is configured of a silicon substrate, for example. As shown in FIG. 22A, the device mounting substrate 4 is mounted with the light emitting device 2 and the photodetector 3. The device mounting substrate 4 is formed with wiring patterns as necessary.

Figure 22C:
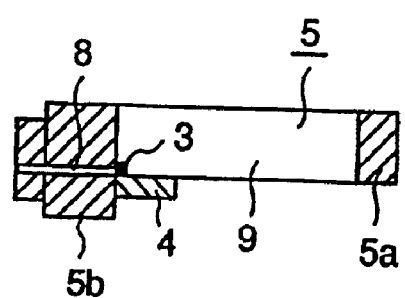

The package 5 has a base part 5a and a sidewall 5b erected on the end face of the base part 5a, having the section approximately L-shaped (see FIG. 22C). The package 5 is configured of resin, for example. The base part 5a of the package 5 is formed with a through hole 9. Additionally, the sidewall 5b is penetratingly formed with one or more of optical fiber insertion holes 8 (four holes in the example shown in FIG. 22A). The optical fiber insertion holes 8 are inserted with optical fibers 10 as shown in FIG. 22A.

The device mounting substrate 4 mounted with the light emitting device 2 and the photodetector 3 and the package 5 are incorporated as shown in FIGS. 22B and 22C, and are adhered and fixed with resin, for example. At this time, the light emitting device 2 and the photodetector 3 are positioned so as to be optically coupled to the corresponding optical fibers 10 inserted into the optical fiber insertion holes 8 in an adjusted state. Additionally, FIG. 22B depicts a schematic diagram illustrating a state of incorporating the device mounting substrate 4 into the package 5, when seeing that shown in FIG. 22A from above. FIG. 22C depicts a section of a line A—A shown in FIG. 22B.

In an example shown in FIG. 22D, the package 5 combined with the device mounting substrate 4 is disposed with the lead frame 6 thereunder, and the package 5 and the lead frame 6 are combined as shown in FIG. 23B.

Figure 24:
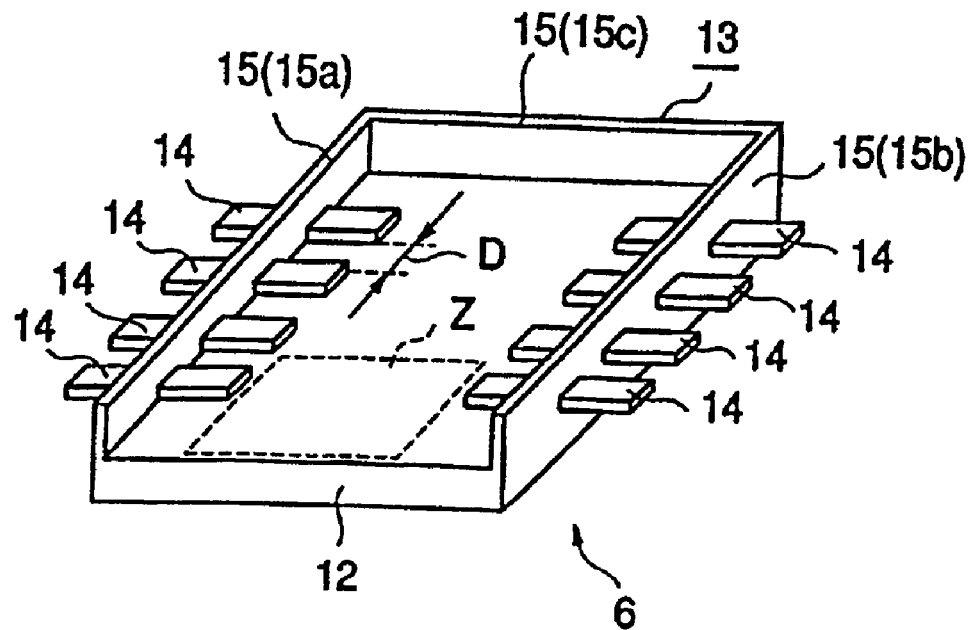
FIG. 24 depicts a model diagram showing one example of the lead frame.

FIG. 24 depicts the simplified lead frame 6. The lead frame 6 is configured to have a bottom wall 12, an enclosure 13, and a plurality of metal lead terminals 14 (eight lead terminals are depicted in the example shown in the drawing). The bottom wall 12 is formed to be rectangular, and the enclosure 13 is erected around the periphery of the bottom wall 12.

The enclosure 13 is configured to have a plurality of sidewalls 15 (three sidewalls 15a, 15b and 15c are depicted in the example shown in FIG. 24). Two sidewalls among the plurality of sidewalls 15 are disposed with space along two sides facing each other among four sides of the periphery of the bottom wall 12. Each of the sidewalls 15a and 15b facing each other is disposed with the plurality of lead terminals 14 so as to project from the inside to the outside of the enclosure 13 at almost equal pitch arrangement (for example, a distance D between the adjacent lead terminals 14 is 1.2 mm).

In incorporating such the lead frame 6 into the package 5, for example, the package 5 is positioned to the lead frame 6 so that an area indicated by a dotted line Z in the lead frame 6 shown in FIG. 24 is faced to the device mounting substrate 4 combined with the package 5. Furthermore, in the assembly process of the package 5 and the lead frame 6, the tip end side of the lead terminals 14 is bent as shown in FIG. 23B. Moreover, the bottom wall 12 of the lead frame 6 is mounted with components such as a preamplifier or formed with wiring patterns on the portion except the area Z (that is, the area facing the device mounting substrate 4).

Figure 25:
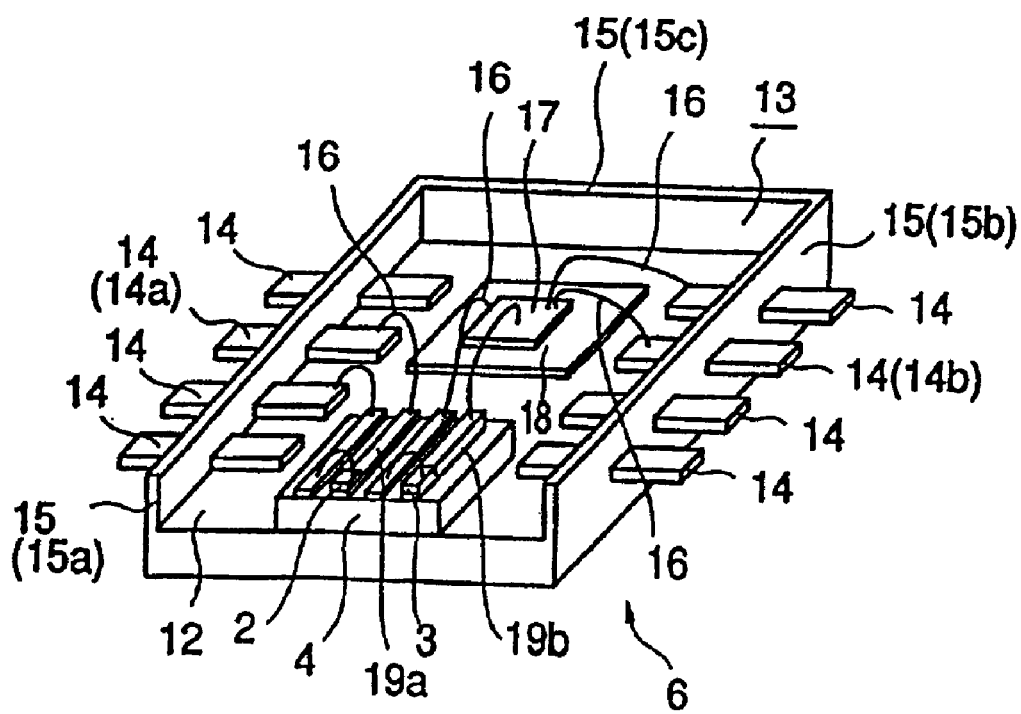
FIG. 25 depicts a model diagram showing an exemplary state of connecting the lead terminals disposed with the lead frame to circuits with bonding wires.

With the package 5 combined with the lead frame 6, the through hole 9 of the package 5 is used to form wire bonding by a wire bonding apparatus as illustrated by the model diagram shown in FIG. 25. Additionally, numerals 16 expressed in FIG. 25 denote a bonding wire. A numeral 17 denotes the preamplifier for amplifying detected current (received signals) outputted from the photodetector 3. A numeral 18 denotes a ground pattern.

In the example shown in FIG. 25, the wire bonding allows the light emitting device 2 to be connected to a lead terminal 14a disposed in the left sidewall 15a in FIG. 25 through a wiring pattern 19a formed on the device mounting substrate 4 and the bonding wire 16. Furthermore, the photodetector 3 is connected to a lead terminal 14b disposed in the right sidewall 15b in FIG. 25 through a wiring pattern 19b formed on the device mounting substrate 4, the bonding wire 16, the preamplifier 17, and the bonding wire 16.

The lead terminal 14a functions as a lead terminal for inputting transmit signals for feeding high frequency electrical signals (drive current) to the light emitting device 2 from outside. The lead terminal 14b functions as a lead terminal for outputting received signals for leading high frequency electrical signals (light detected current) outputted from the photodetector 3 to outside. In this proposed example, the lead terminal 14a for inputting transmit signals and the lead terminal 14b for outputting received signals have positional relationship where the tip ends thereof are approximately faced each other.

After wire bonding, an adhesive 20 such as resin is injected from the through hole 9 of the package 5 as shown in FIG. 23B.

An assembly of the package 5 and the lead frame 6 is combined with the adapter 7 shown in FIG. 23A to configure the optical fiber module 1 as shown in FIG. 23C.

Such the optical fiber module 1 is extremely small, and the light emitting device 2 is close to the photodetector 3. For example, according to the recent standards of optical fiber ribbons, a pitch between optical fibers arranged side by side is 250 $\mu$m. When an optical fiber ribbon having such the standards is optically connected to the light emitting device 2 and the photodetector 3, it is ideal that the interval between the light emitting device 2 and the photodetector 3 is set 250 $\mu$m, the same as the pitch between the arranged optical fibers.

Additionally, the light emitting device 2 is generally driven by a current (electrical signal) of 10 mA or above, whereas the current (electrical signal) outputted from the photodetector 3 is a few digits smaller than the current to drive the light emitting device 2, being an order of $\mu A$, for example. Particularly, because of the demand that a fewer relay stations communicate with a greater number of receiving stations in optical communications, it is important to enhance the light receiving sensitivity of the photodetector 3. To this end, the minimum receiving sensitivity of −30 dBm (0.001 mW) or under is required on the application of about a few hundreds Mbit/sec, for example. In some cases, the current outputted from the photodetector 3 may be an order of $\mu A$ or under.

Since the current (electrical signal) outputted from the photodetector 3 is significantly smaller than the current (electrical signal) fed to the light emitting device 2 in addition to the narrow interval between the light emitting device 2 and the photodetector 3, electrical crosstalk from the light emitting device 2 side to the photodetector 3 side is a serious problem. It has been important to solve the crosstalk issue.

In one aspect, the invention is to provide an optical fiber module lead frame and an optical fiber module capable of suppressing the electrical crosstalk from the light emitting device side to the photodetector side.

Hereafter, embodiments of the invention will be described in accordance with the drawings.

In order to suppress the electrical crosstalk from the light emitting device side to the photodetector side, the inventor took notice of the lead terminals of the lead frame. It is because of the following reasons. For example, in the optical fiber module of the proposed example, the lead terminal for inputting transmit signals and the lead terminal for outputting received signals of the lead frame have the positional relationship where the tip ends thereof are faced each other. Additionally, the lead terminal for inputting transmit signals generates an electric field according to the electrical signals of the lead terminal for inputting transmit signals. The electric field mainly spreads straight ahead from the tip end of the lead terminal for inputting transmit signals, and thus a large electric field is generated between the tip ends of the lead terminal for inputting transmit signals and the lead terminal for outputting received signals facing each other.

The electrical signals carried through the lead terminal for inputting transmit signals are significantly greater than the electrical signals carried through the lead terminal for outputting received signals. On this account, due to the generation of the electric field between the tip ends of the lead terminal for inputting transmit signals and the lead terminal for outputting received signals, the greater electrical signals of the lead terminal for inputting transmit signals adversely affect the smaller electrical signals of the lead terminal for outputting received signals. More specifically, the electrical crosstalk from the lead terminal for inputting transmit signals to the lead terminal for outputting received signals (from the light emitting device side to the photodetector side) happens to occur.

The inventor noticed that the electrical crosstalk from the light emitting device side to the photodetector side can be reduced by suppressing the electric field between the tip ends of the lead terminal for inputting transmit signals and the lead terminal for outputting received signals.

Then, the inventor invented the optical fiber module lead frame capable of suppressing the electric field between the tip ends of the lead terminal for inputting transmit signals and the lead terminal for outputting received signals, and the optical fiber module provided with the same. In order to suppress the electric field between the tip ends of the lead terminal for inputting transmit signals and the lead terminal for outputting received signals, the following configurations ($\alpha$), ($\beta$), and ($\gamma$) are considered, for example.

($\alpha$) The tip ends of the lead terminal for inputting transmit signals and the lead terminal for outputting received signals are disposed not to face each other.

($\beta$) A component having a ground potential is disposed between the tip ends of the lead terminal for inputting transmit signals and the lead terminal for outputting received signals to suppress or prevent the electric field between the tip ends of the lead terminal for inputting transmit signals and the lead terminal for outputting received signals.

($\gamma$) A lead terminal disposed adjacent to at least one of the lead terminal for inputting transmit signals and the lead terminal for outputting received signals is grounded. Also, the interval between the ground lead terminal and the lead terminal for inputting transmit signals, or the interval between that and the lead terminal for outputting received signals is narrowed. The ground lead terminal exerts the effect of suppressing the electric field of the lead terminal for inputting transmit signals or lead terminal for outputting received signals, and the electric field between the tip ends of the lead terminal for inputting transmit signals and the lead terminal for outputting received signals is suppressed.

Hereafter, embodiments of the lead frame capable of suppressing the electric field and the optical fiber module provided with the same will be shown. Additionally, in the description of each of the following embodiments, the same components as the optical fiber module or lead frame of the proposed example described above are designated the same numerals and signs, omitting the overlapping description of the common portions.

Figure 1:
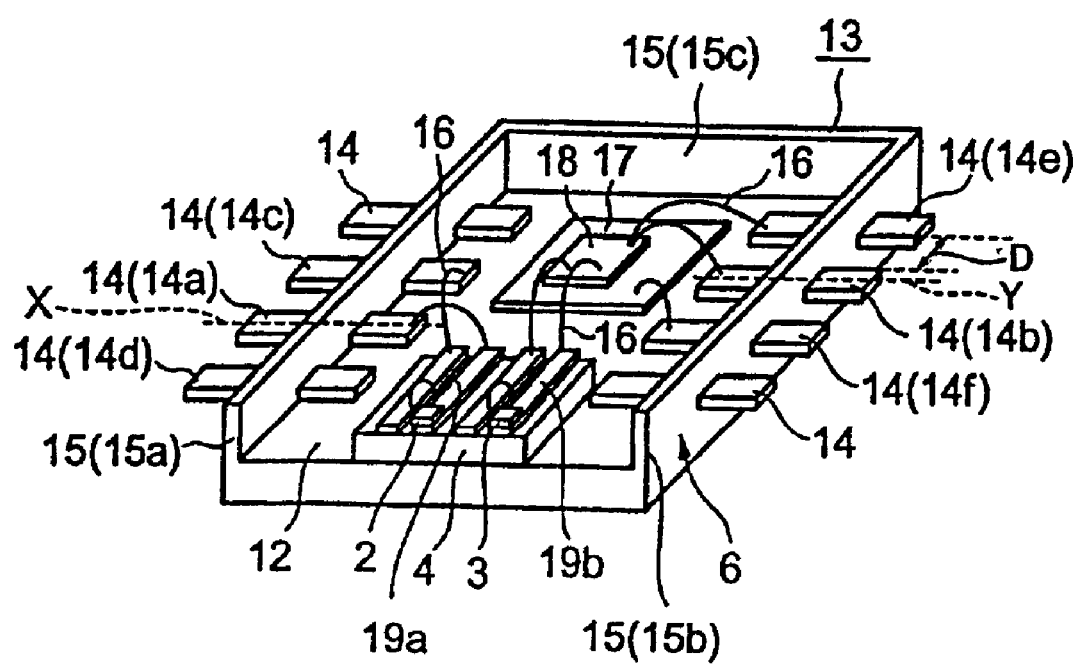
FIG. 1 depicts a diagram for illustrating an optical fiber module and a lead frame disposed therein of a first embodiment.

FIG. 1 depicts a simplified example of the state of connecting lead terminals of a lead frame configuring a first embodiment to a light emitting device or photodetector. In the first embodiment, the configuration ($\alpha$) suppresses the electric field between the tip ends of the lead terminal for inputting transmit signals and the lead terminal for outputting received signals.

More specifically, in the first embodiment, a lead terminal 14a allowed to function as the lead terminal for inputting transmit signals and a lead terminal 14b allowed to function as the lead terminal for outputting received signals are formed to have positional relationship where the tip ends inside the lead frame are not faced each other. Additionally, the other configurations of the optical fiber module of the first embodiment are almost the same as the proposed example.

In the first embodiment, one of a plurality of lead terminals 14 disposed in a sidewall 15a of a lead frame 6 (the second lead terminal 14 from the near side in the example shown in FIG. 1) is connected to a light emitting device 2 through a bonding wire 16 and a wiring pattern 19a. This lead terminal 14 functions as the lead terminal 14a for inputting transmit signals.

Furthermore, among a plurality of lead terminals 14 disposed in a sidewall 15b facing to the sidewall 15a, one of the lead terminals arranged on the positions not facing to the lead terminal 14a for inputting transmit signals (the third lead terminal 14 from the near side in the example shown in FIG. 1) is connected to a photodetector 3 through a bonding wire 16, a preamplifier 17 and a wiring pattern 19b. This lead terminal 14 functions as the lead terminal 14b for outputting received signals.

A center line X of the lead terminal 14a for inputting transmit signals and a center line Y of the lead terminal 14b for outputting received signals are in parallel each other and are not in the same straight line.

Moreover, in the example shown in FIG. 1, a lead terminal 14c disposed in the sidewall 15a functions as a negative lead terminal for transmission for feeding electrical drive signals to the light emitting device 2. A lead terminal 14d functions as a ground terminal on the transmission side. Besides, a lead terminal 14e disposed in the sidewall 15b functions as a bias terminal for the preamplifier 17. A lead terminal 14f functions as a ground terminal on the receiving side.

Figure 26:
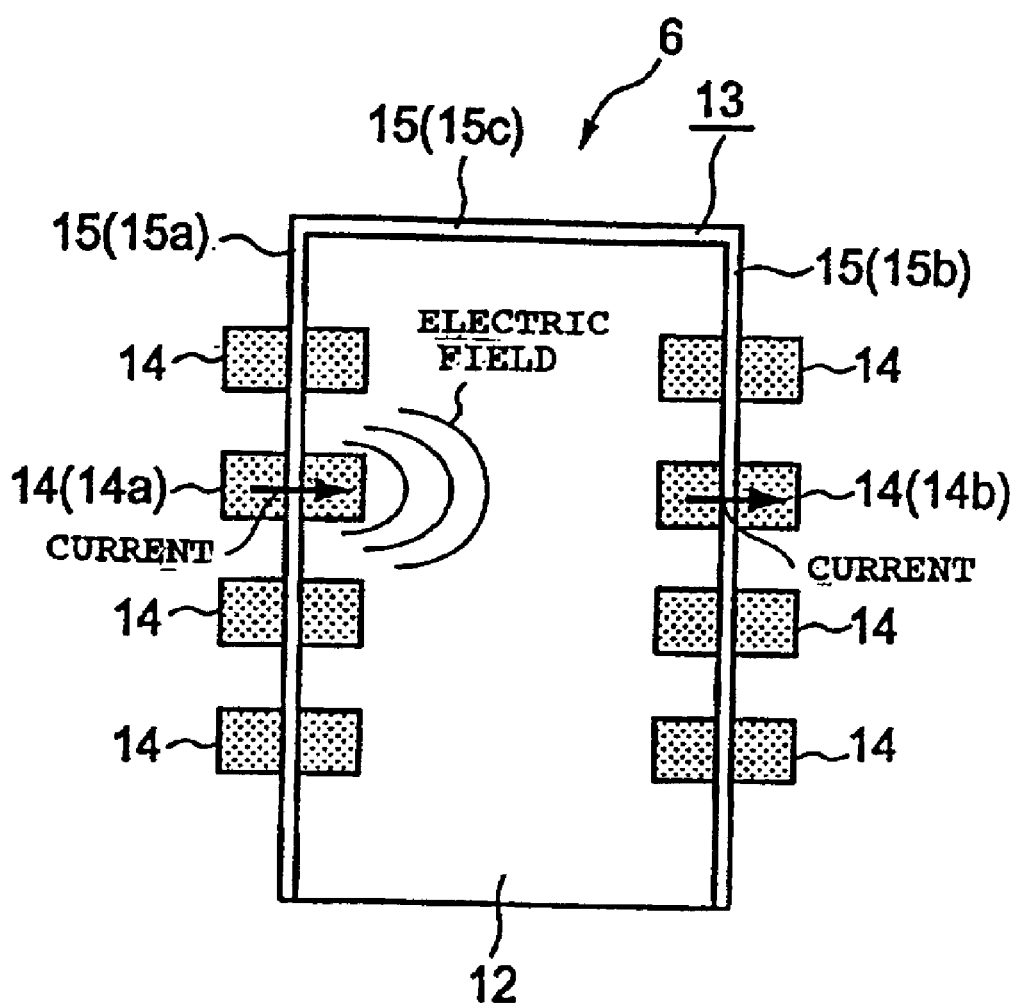
FIG. 26 depicts a diagram for illustrating one source of generating crosstalk from the light emitting device side to the photodetector side.

In the first embodiment, the lead terminal 14a for inputting transmit signals and the lead terminal 14b for outputting received signals are disposed in the positional relationship where the tip ends are not faced each other, and thus the amount of crosstalk from the light emitting device 2 side to the photodetector 3 side can be reduced. More specifically, the electric field of the lead terminal 14a for inputting transmit signals caused by the current carrying of electrical signals (high frequency signals) mainly spreads straight ahead from the tip end of the lead terminal 14a for inputting transmit signals as illustrated in the model diagram in FIG. 26, according to the current carrying direction of the signals (current). On this account, when the lead terminal 14a for inputting transmit signals and the lead terminal 14b for outputting received signals are disposed in the positional relationship where the tip ends are faced each other as the proposed example, a greater electric field is generated between the tip ends of the lead terminal 14a for inputting transmit signals and the lead terminal 14b for outputting received signals to adversely affect electrical signals of the lead terminal 14b for outputting received signals. The electrical signals of the lead terminal 14b for outputting received signals are significantly smaller than the electrical signals of the lead terminal 14a for inputting transmit signals, and therefore the adverse effect on the lead terminal 14b side from the lead terminal 14a side is enormous.

That is, noises caused by the electrical signals of the lead terminal 14a for inputting transmit signals are overlaid with the electrical signals of the lead terminal 14b for outputting received signals. Because the electrical signals of the lead terminal 14a for inputting transmit signals are significantly greater than the electrical signals of the lead terminal 14b for outputting received signals, a noise component due to crosstalk is considerably greater than the magnitude of the electrical signals of the lead terminal 14b for outputting received signals, and thus crosstalk is a serious issue.

On the other hand, in the first embodiment, the lead terminal 14a for inputting transmit signals and the lead terminal 14b for outputting received signals are disposed in the positional relationship where the tip ends are not faced each other. More specifically, the lead terminal 14b for outputting received signals is disposed at the position hardly subject to the adverse effect of the electric field of the lead terminal 14a for inputting transmit signals. Accordingly, the electric field between the tip ends of the lead terminal 14a for inputting transmit signals and the lead terminal 14b for outputting received signals is suppressed, and the phenomenon that the noises caused by the electrical signals of the lead terminal 14a for inputting transmit signals are overlaid with the electrical signals of the lead terminal 14b for outputting received signals can be reduced. That is, the amount of crosstalk from the lead terminal 14a side to the lead terminal 14b side (the light emitting device 2 side to the photodetector 3 side) can be decreased.

Additionally, in the first embodiment, only changing the wiring structure of the bonding wires 16 can obtain the excellent effect as described above. Therefore, the optical fiber module can be fabricated with almost no increase in material cost or in fabrication processes of the optical fiber module.

Furthermore, when the amount of crosstalk is to be reduced as each of the tip ends of the lead terminal 14a for inputting transmit signals and the lead terminal 14b for outputting received signals is faced each other as the proposed example, it is considered to increase the interval between the tip ends of the lead terminal 14a for inputting transmit signals and the lead terminal 14b for outputting received signals. However, in this case, the lead frame 6 (optical fiber module) is scaled up. On the other hand, in the first embodiment, the lead terminal 14a for inputting transmit signals and the lead terminal 14b for outputting received signals are only disposed so as not to face the tip ends each other, and then crosstalk can be reduced. On this account, the interval between the tip ends of the lead terminal 14a for inputting transmit signals and the lead terminal 14b for outputting received signals does not need to be set wide. Thus, the lead frame 6 (optical fiber module) is prevented from being scaled up.

Accordingly, the provision of the configuration of the first embodiment can provide the low-cost, small-sized optical fiber module and lead frame capable of suppressing crosstalk.

Particularly, the configuration of the first embodiment is significantly effective in the following optical fiber module. The optical fiber module is an optical fiber module having the conditions that the high sensitivity of −20 dBm or greater is required as the minimum receiving sensitivity of the photodetector 3, electrical drive signals (drive current) fed to the light emitting device 2 is 5 mA or greater, and the interval between the center of emitting light of the light emitting device 2 and the center of receiving light of the photodetector 3 is one mm or under.

Additionally, in the fist embodiment, when the arranged positions of the light emitting device 2 and the photodetector 3 are on the near side as shown in FIG. 1, the second lead terminal 14a from the near side is allowed to function as the lead terminal for inputting transmit signals among the plurality of lead terminals 14 in the left sidewalls 15a. Furthermore, the third lead terminal 14b from the near side is allowed to function as the lead terminal for outputting received signals among the plurality of lead terminals 14 in the right sidewalls 15b. However, it is acceptable when the lead terminal 14a for inputting transmit signals and the lead terminal 14b for outputting received signals have the positional relationship where the tip ends are not faced each other. The arranged positions are not limited to those shown in the first embodiment. For example, as shown in FIG. 2, a fourth lead terminal 14a from the near side may be functioned as the lead terminal for inputting transmit signals among the plurality of lead terminals in the left sidewall 15a.

In this case, a third lead terminal 14b from the near side may be functioned as the lead terminal for outputting received signals among the plurality of lead terminals 14 in the right sidewall 15b. Moreover, as shown in FIG. 3, a first lead terminal 14b from the near side may be functioned as the lead terminal for outputting received signals among the plurality of lead terminals 14 in the right sidewall 15b.

Figure 2:
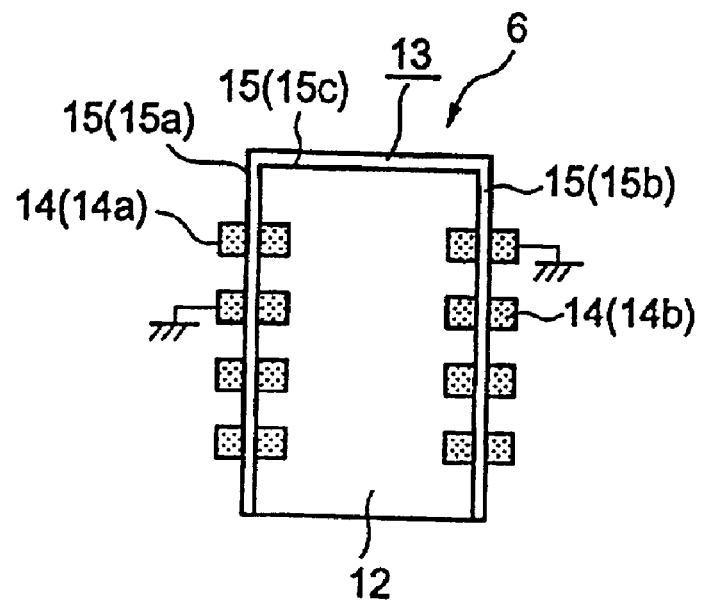
FIG. 2 depicts a diagram for illustrating a modified example of the optical fiber module and the lead frame of the first embodiment.
Figure 3:
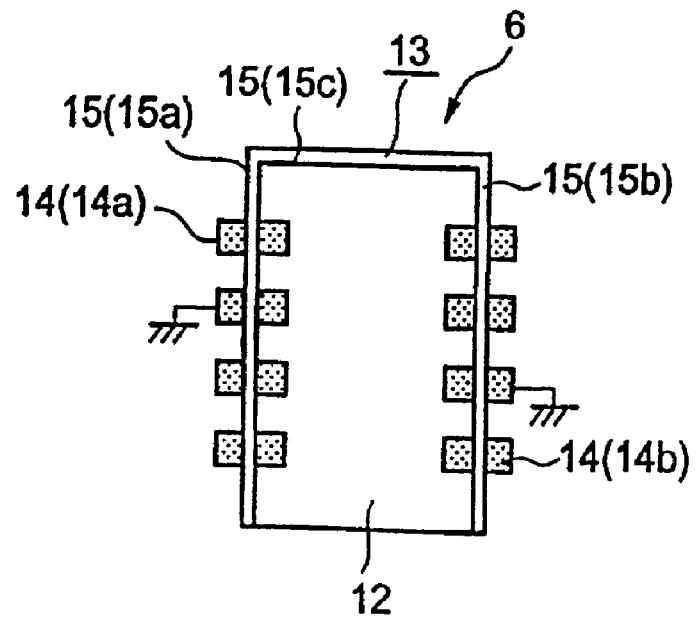
FIG. 3 depicts a diagram for illustrating another modified example of the optical fiber module and the lead frame of the first embodiment.

When the lead terminal 14a for inputting transmit signals and the lead terminal 14b for outputting received signals have the positional relationship shown in FIG. 3, the interval between the lead terminal 14a for inputting transmit signals and the lead terminal 14b for outputting received signals becomes wider than the example shown in FIG. 1 or 2. On this account, the electrical signals of the lead terminal 14b for outputting received signals are further hardly subject to the electrical signals of the lead terminal 14a for inputting transmit signals. Accordingly, it is further preferable to intend to reduce the amount of crosstalk from the light emitting device 2 side to the photodetector 3 side.

Hereafter, a second embodiment will be described. The second embodiment shows another exemplary form of the configuration (α).

Figure 4:
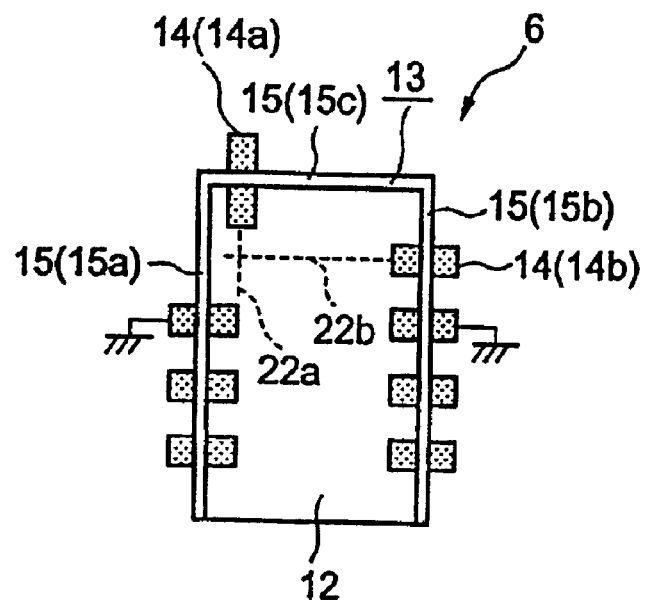
FIGS. 4 and 5 depict diagrams for illustrating an optical fiber module and a lead frame disposed therein of a second embodiment.
Figure 5:
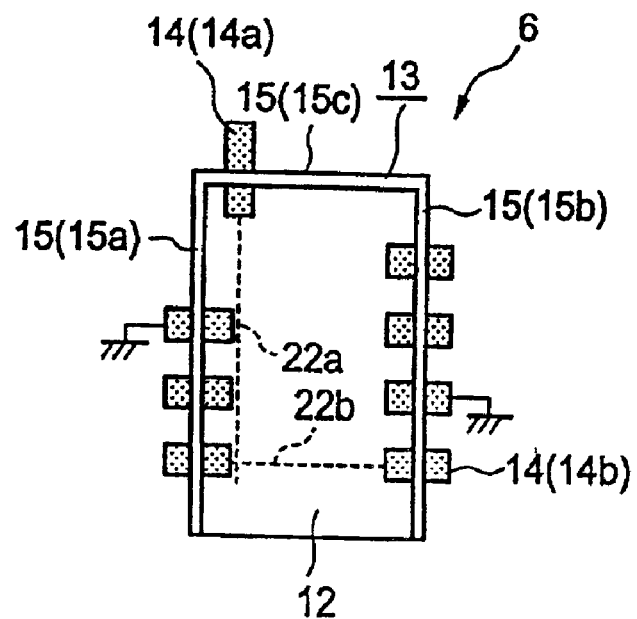

In the second embodiment, the lead frame 6 configuring the optical fiber module has the form as shown in FIGS. 4 and 5. The other configurations are the same as the first embodiment. Additionally, in the description of the second embodiment, the same components as the first embodiment are designated the same numerals and signs, omitting the overlapping description of the common portions.

More specifically, in the examples shown in FIGS. 4 and 5, the lead terminal 14b for outputting received signals is disposed in the sidewall 15b forming the enclosure 13 of the lead frame 6. The lead terminal 14a for inputting transmit signals is disposed in the sidewall 15c adjacent to the sidewall 15b. That is, the lead terminal 14a for inputting transmit signals and the lead terminal 14b for outputting received signals are disposed so that an extended central axis 22a extending the central axis of the lead terminal 14a for inputting transmit signals crosses an extended central axis 22b extending the central axis of the lead terminal 14b for outputting received signals. In the examples shown in FIGS. 4 and 5, the extended central axis 22a of the lead terminal 14a for inputting transmit signals is orthogonal to the extended central axis 22b of the lead terminal 14b for outputting received signals.

Furthermore, in FIG. 5, the interval between the lead terminal 14a for inputting transmit signals and the lead terminal 14b for outputting received signals is set wider than that in the form shown in FIG. 4. On this account, the form shown in FIG. 5 allows reduction in the amount of crosstalk from the light emitting device 2 to the photodetector 3 more than the form shown in FIG. 4 because of the interval set wider.

In the second embodiment, the lead terminal 14a for inputting transmit signals was disposed in one of the adjacent sidewalls 15a and 15c, and the lead terminal 14b for outputting received signals was disposed in the other. Therefore, the lead terminal 14a for inputting transmit signals and the lead terminal 14b for outputting received signals have positional relationship where the central axis 22a crosses (is orthogonal to) the central axis 22b. On this account, the electric field generation between the tip ends of the lead terminal 14a for inputting transmit signals and the lead terminal 14b for outputting received signals can be suppressed. Thus, noises caused by the electrical signals of the lead terminal 14a for inputting transmit signals are further hardly overlaid with the electrical signals of the lead terminal 14b for outputting received signals. Accordingly, the amount of crosstalk from the light emitting device 2 side to the photodetector 3 side can be reduced.

Moreover, also in the second embodiment, the amount of crosstalk from the light emitting device 2 side to the photodetector 3 side can be reduced without increasing material cost or fabrication processes, or without scaling up the lead frame 6 (optical fiber module 1).

Figure 6:
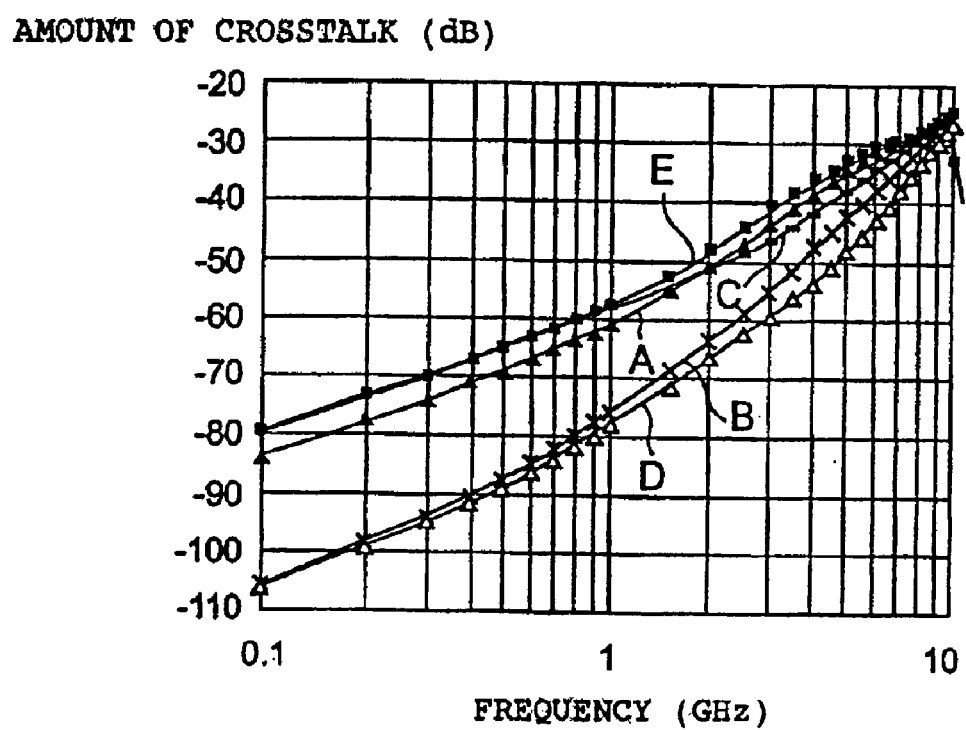
FIG. 6 depicts a graph showing the results of simulations that examined the effects obtained by the configurations of the first and second embodiments.

The inventor has confirmed the effect of reducing crosstalk by the results of simulations. FIG. 6 depicts a graph illustrating the results of simulations. In the simulations, it was examined how the relationship between frequencies of the electrical signals of the lead terminal 14a for inputting transmit signals and the amount of crosstalk from the light emitting device 2 side to the photodetector 3 side is varied according to the arrangement form of the lead terminal 14a for inputting transmit signals and the lead terminal 14b for outputting received signals. A curve A depicted in FIG. 6 is in the case of the form shown in FIG. 2 (first embodiment). A curve B is in the case of the form shown in FIG. 3 (first embodiment). A curve C is in the case of the form shown in FIG. 4 (second embodiment). A curve D is in the case of the form shown in FIG. 5 (second embodiment). A curve E is in the case of the form of the proposed example shown in FIG. 26.

As shown in FIG. 6, the arrangement form of the lead terminal 14a for inputting transmit signals and the lead terminal 14b for outputting received signals shown in the first or second embodiment is provided, whereby it can be confirmed that it is possible to reduce the amount of crosstalk from the light emitting device 2 side to the photodetector 3 side as compared with the proposed example.

Additionally, the results of simulations in FIG. 6 reveal that the amount of crosstalk is further reduced as the interval between the lead terminal 14a for inputting transmit signals and the lead terminal 14b for outputting received signals is set wider. Furthermore, as shown in the second embodiment, the lead terminal 14a for inputting transmit signals and the lead terminal 14b for outputting received signals are arranged so that the extended central axis 22a of the lead terminal 14a for inputting transmit signals crosses the extended central axis 22b of the lead terminal 14b for outputting received signals, whereby it is understood that the amount of crosstalk can be further reduced.

Moreover, in the examples shown in FIGS. 4 and 5, the lead terminal 14a for inputting transmit signals was disposed in the sidewall 15c. However, the lead terminal 14a for inputting transmit signals may be disposed in the sidewall 15a as similar to the first embodiment, and the lead terminal 14b for outputting received signals may be disposed in the sidewall 15c. Also, this case can of course obtain the same effect as described above.

Hereafter, a third embodiment will be described. The third embodiment shows still another form of the configuration (α).

Figure 7:
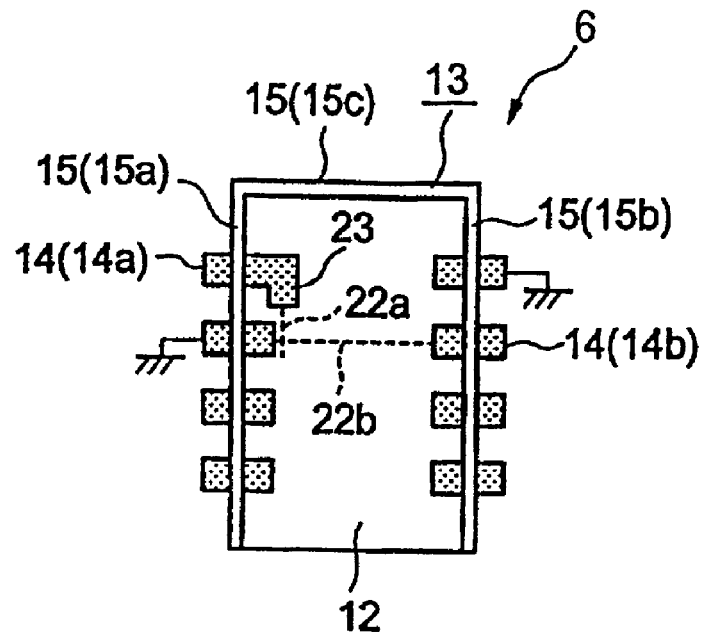
FIGS. 7 and 8 depict diagrams for illustrating a third embodiment.
Figure 8:
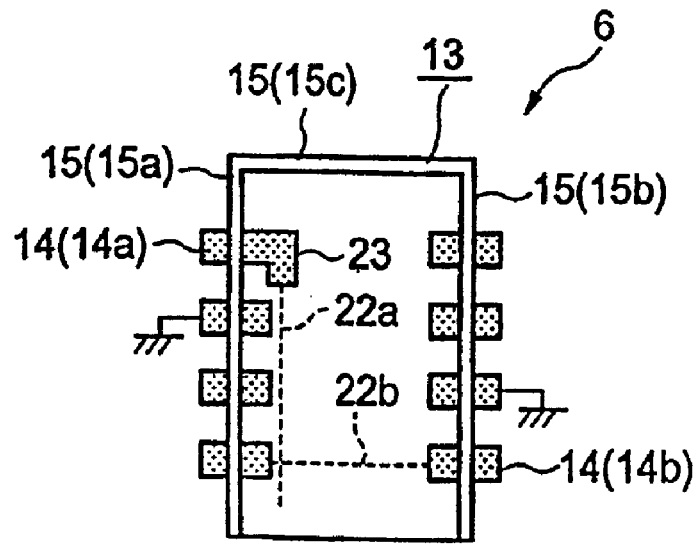

In the third embodiment, the lead frame 6 configuring the optical fiber module has the forms as shown FIGS. 7 and 8. The other configurations are the same as the first or second embodiment. Additionally, in the description of the third embodiment, the same components as the first or second embodiment are designated the same numerals and signs, omitting the overlapping description of the common portions.

In the third embodiment, the lead terminal 14a for inputting transmit signals is disposed in one of the sidewalls 15a and 15b facing each other with space (the sidewall 15a in the examples shown in FIGS. 7 and 8). Additionally, the lead terminal 14b for outputting received signals is disposed in the other (sidewall 15b). Furthermore, in the examples shown in FIGS. 7 and 8, the arranged position of the lead terminal 14a for inputting transmit signals in the sidewall 15a differs from the arranged position of the lead terminal 14b for outputting received signals in the sidewall 15b, as similar to the first embodiment.

Moreover, at least one of the lead terminal 14a for inputting transmit signals and the lead terminal 14b for outputting received signals has the bent tip end part (the lead terminal 14a for inputting transmit signals in the examples shown in FIGS. 7 and 8). That is, in the third embodiment, the lead terminal 14a for inputting transmit signals has the tip end part inside the enclosure 13 bent perpendicularly. According to this bent part 23, it is configured that the extended central axis 22a extending the central axis of the lead terminal 14a for inputting transmit signals from the inner tip end crosses the extended central axis 22b extending the central axis of the lead terminal 14b for outputting received signals from the inner tip end, as similar to the second embodiment. In the examples shown in FIGS. 7 and 8, the extended central axis 22a of the lead terminal 14a for inputting transmit signals is orthogonal to the extended central axis of the lead terminal 14b for outputting received signals.

The third embodiment can also exert the effect of reducing the amount of crosstalk from the light emitting device 2 side to the photodetector 3 side as similar to the first or second embodiment.

Additionally, the configuration (α) is not limited to the form of each of the first to third embodiments, which can adopt various forms. For example, in each of the first to third embodiments, four lead terminals 14 were disposed in both the right and left sides of the lead frame 6. However, the number of the lead terminals 14 disposed is not defined as long as it is plural.

Furthermore, each of the first to third embodiments showed the example of disposing the single light emitting device 2 and the single photodetector 3, but it may be configured to have an arrayed light emitting device and an arrayed photodetector. In this case, disposed are a plurality of lead terminals 14a for inputting transmit signals corresponding to each of light emitting devices forming the arrayed light emitting device one on one, and a plurality of lead terminals 14b for outputting received signals corresponding to each of photodetectors forming the arrayed photodetector one on one. Also in this case, the plurality of lead terminals 14a for inputting transmit signals and the plurality of lead terminals 14b for outputting received signals are configured as similar to each of the first to third embodiments, whereby the same effect as each of the first to third embodiments can be exerted.

Moreover, in the second or third embodiment, the extended central axis 22a of the lead terminal 14a for inputting transmit signals was orthogonal to the extended central axis 22b of the lead terminal 14b for outputting received signals. However, it is acceptable that the extended central axes 22a and 22b are crossed; the angle crossed is not limited to an angle of 90 degrees.

Hereafter, a fourth embodiment will be described. In the fourth embodiment, an exemplary form according to the configuration (β) will be described.

Figure 9:
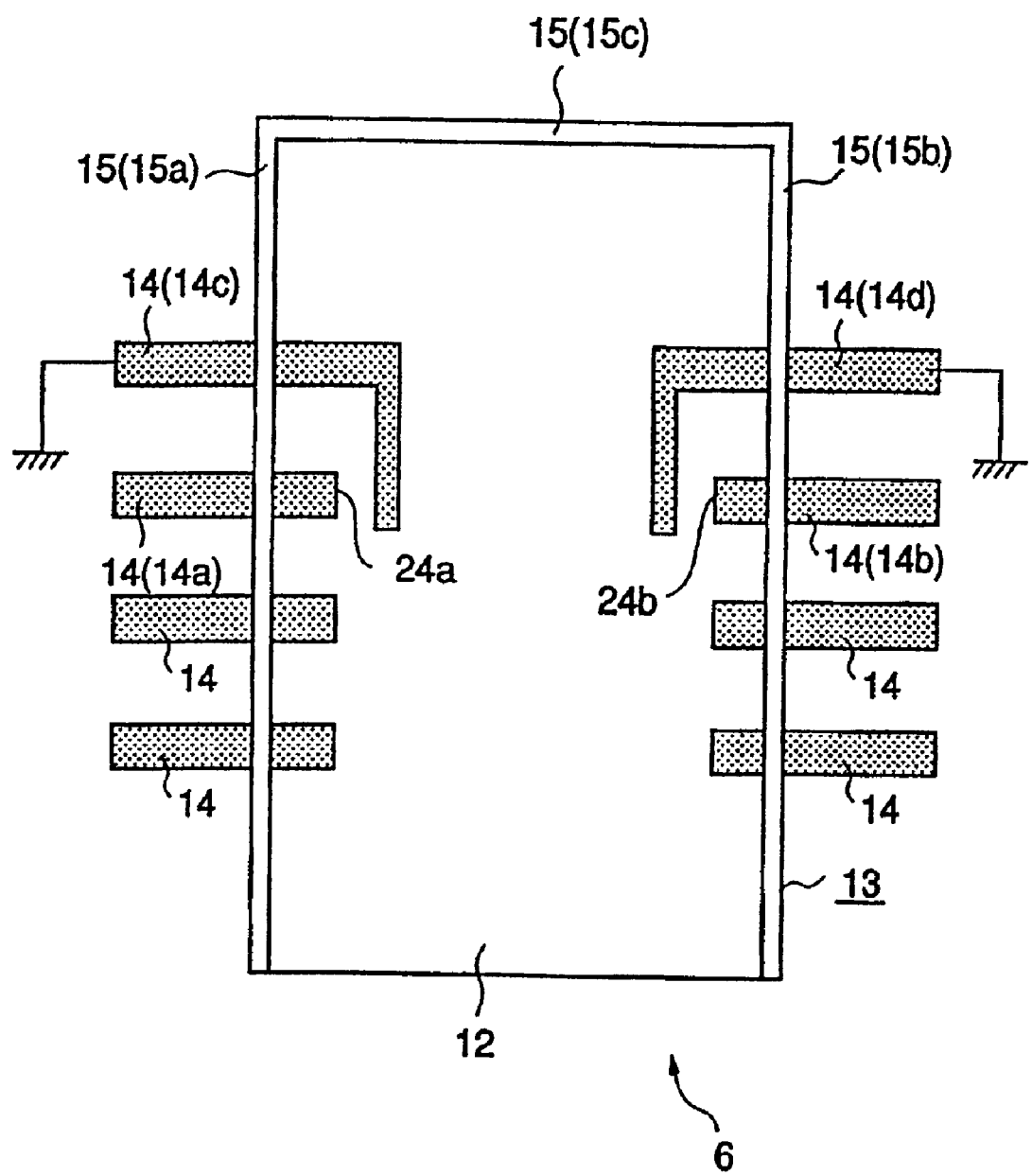
FIG. 9 depicts a diagram for illustrating a fourth embodiment.

FIG. 9 schematically depicts the lead frame configuring the optical fiber module of the fourth embodiment, extracting the lead frame. The forth embodiment is characterized by the shapes and arrangement of the ground lead terminals 14c and 14d. The other configurations are almost the same as the proposed example. Additionally, in the description of the fourth embodiment, the same components as the proposed example are designated the same numerals and signs, omitting the overlapping description of the common portions.

In the fourth embodiment, the lead terminals 14c and 14d adjacent to the lead terminal 14a for inputting transmit signals and the lead terminal 14b for outputting received signals, respectively, function as the ground lead terminals. Each of the tip end parts of the ground lead terminals 14c and 14d is extended to form the shape that interrupts between an inner tip end part 24a of the lead terminal 14a for inputting transmit signals and an inner tip end part 24b of the lead terminal 14b for outputting received signals. In the fourth embodiment, each of the ground lead terminals 14c and 14d is formed into a bent shape of approximately an L-shape.

Figure 10:
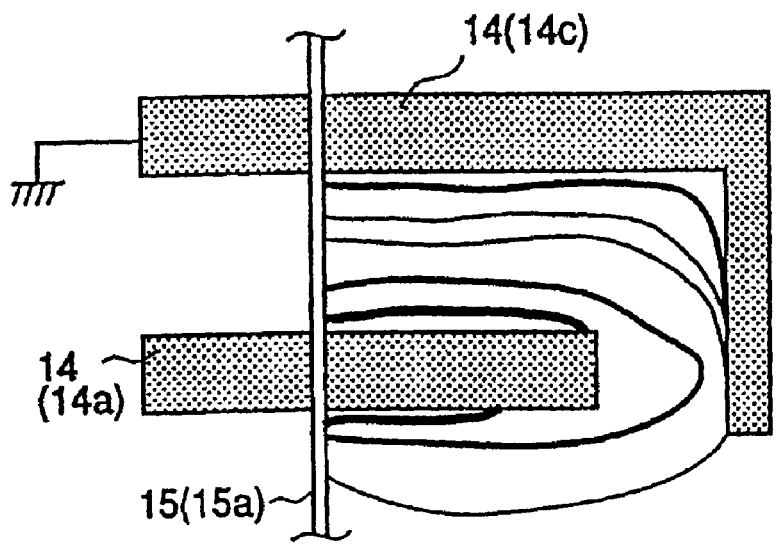
FIG. 10 depicts a diagram for illustrating the effect of reducing an amount of crosstalk in the case where ground lead terminals are made to have the form shown in FIG. 9.
Figure 11:
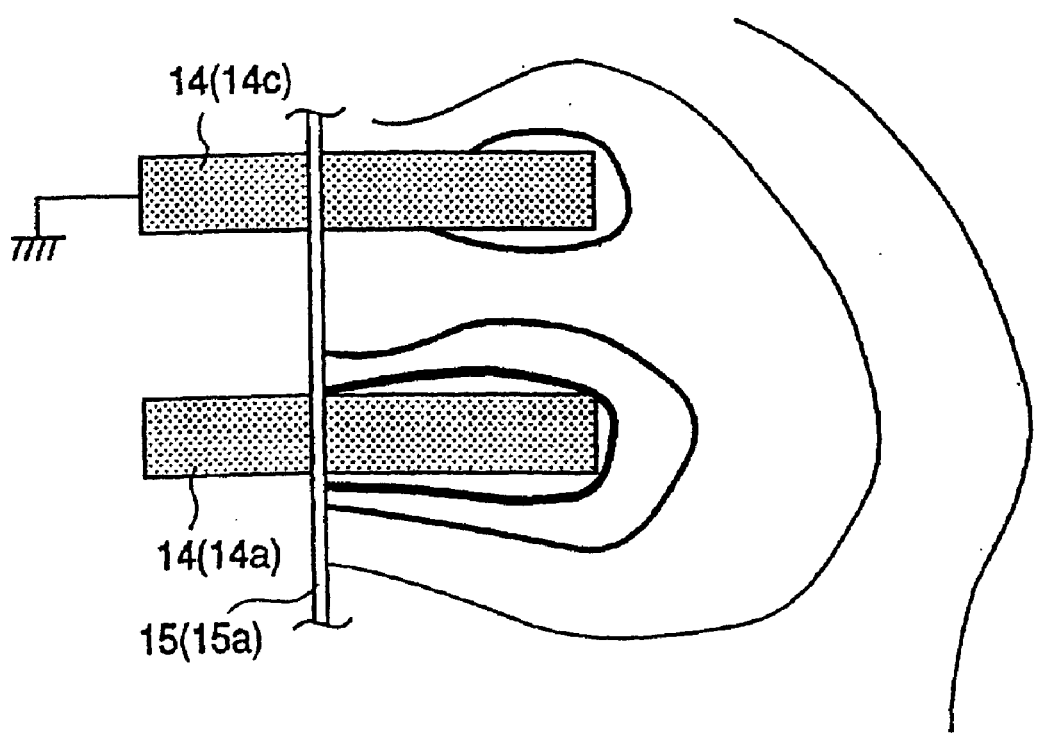
FIG. 11 depicts a diagram showing a comparative example to FIG. 10.

FIGS. 10 and 11 schematically depict a status of generating the electric field caused by the current carrying of the electrical signals of the lead terminal 14a for inputting transmit signals by the distributions of the field strength. FIG. 10 is the case of the fourth embodiment, and FIG. 11 is the proposed example.

When the form of the fourth embodiment, the ground lead terminal 14c blocks the electric field caused by the current carrying of the lead terminal 14a for inputting transmit signals to spread as the proposed example shown in FIG. 11. Therefore, the electric field generation between the lead terminal 14a for inputting transmit signals and the lead terminal 14b for outputting received signals is suppressed, and the amount of crosstalk from the lead terminal 14a for inputting transmit signals to the lead terminal 14b for outputting received signals (the light emitting device 2 side to the photodetector 3 side) can be reduced.

Additionally, the fourth embodiment is only configured in which the ground lead terminals 14c and 14d are disposed adjacent to the lead terminal 14a for inputting transmit signals and the lead terminal 14b for outputting received signals, respectively, and the shape of the ground lead terminals 14c and 14d is formed into approximately an L-shape. On this account, complex work, a rise in material cost, or an increase in the fabrication processes can be suppressed. Furthermore, the lead frame 6 does not need to be scaled up in order to reduce the amount of crosstalk from the lead terminal 14a for inputting transmit signals to the lead terminal 14b for outputting receiving signals. Accordingly, the low-cost, small-sized optical fiber module 1 and lead frame 6 capable of suppressing the amount of crosstalk can be provided.

Hereafter, a fifth embodiment will be described. The fifth embodiment shows another exemplary form according to the configuration (β).

Figure 12:
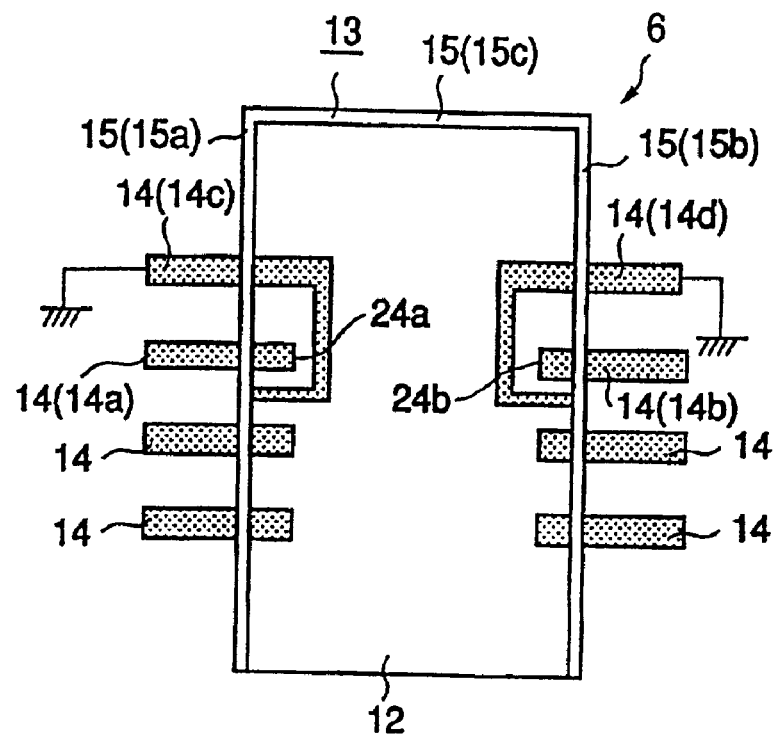
FIGS. 12 and 13 depict diagrams for illustrating a fifth embodiment.
Figure 13:
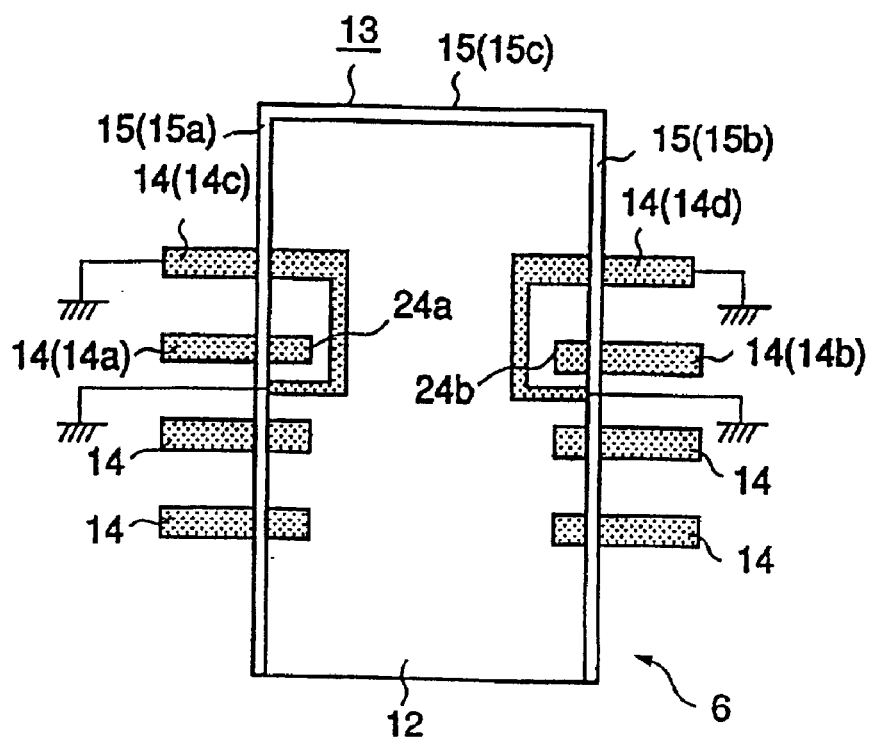

In the fifth embodiment, the lead frame 6 configuring the optical fiber module 1 has the forms shown in FIGS. 12 and 13. The other configurations are almost the same as the fourth embodiment. Additionally, in the description of the fifth embodiment, the same components as the fourth embodiment are designated the same numerals and signs, omitting the overlapping description of the common portions.

More specifically, in the fifth embodiment, the lead terminals 14c and 14d adjacent to the lead terminal 14a for inputting transmit signals and the lead terminal 14b for outputting received signals, respectively, function as the ground lead terminals. Each of the tip end parts of the ground lead terminals 14c and 14d is extended to form the shape that encloses the tip end part 24a of the lead terminal 14a for inputting transmit signals inside the enclosure or the tip end part 24b of the lead terminal 14b for outputting received signals inside the enclosure with space. That is, each of the tip end parts of the ground lead terminals 14c and 14d is formed into a bent shape of approximately a U-shape.

Meanwhile, as shown in the fifth embodiment, when the tip end parts of the ground lead terminals 14c and 14d are extended to elongate the distance from one end side to the other end side, the other end side (open end side) is floated from the ground in the case where only one end part side of the ground lead terminals 14c and 14d is grounded as shown in FIG. 12. In this case, when the frequency of the electrical signals of the lead terminal 14a for inputting transmit signals becomes high, the electric field due to the electrical signals of the lead terminal 14a for inputting transmit signals might be generated from the ground lead terminals 14c and 14d. When the electric field is generated in this manner, the electrical signals of the lead terminal 14a for inputting transmit signals indirectly exert the effect on the electric signals of the lead terminal 14b for outputting received signals through the ground terminal 14c (14d). That is, crosstalk from the lead terminal 14a for inputting transmit signals to the lead terminal 14b for outputting received signals is generated, which is not in a preferable state.

On this account, when the electric field might be generated from the ground lead terminals 14c and 14d, which adversely affects the lead terminal 14b for outputting received signals because of the high frequency of the lead terminal 14a for inputting transmit signals, for example, both ends of the ground lead terminals 14c and 14d are grounded as shown in FIG. 13. In this manner, it is desirable to have ground potential throughout the ground lead terminals 14c and 14d.

As described above, in the fifth embodiment, each of the tip end parts of the ground lead terminals 14c and 14d was extended to have the shape that encloses the tip end part 24a of the adjacent lead terminal 14a for inputting transmit signals inside the enclosure or the tip end part 24b of the lead terminal 14b for outputting received signals inside the enclosure with space. On this account, the ground lead terminals 14c and 14d can further suppress the spread of the electric field from the lead terminal 14a for inputting transmit signals to the lead terminal 14b for outputting received signals. Therefore, the crosstalk from the lead terminal 14a for inputting transmit signals to the lead terminal 14b for outputting received signals (the light emitting device 2 side to the photodetector 3 side) can surely be suppressed.

Figure 14:
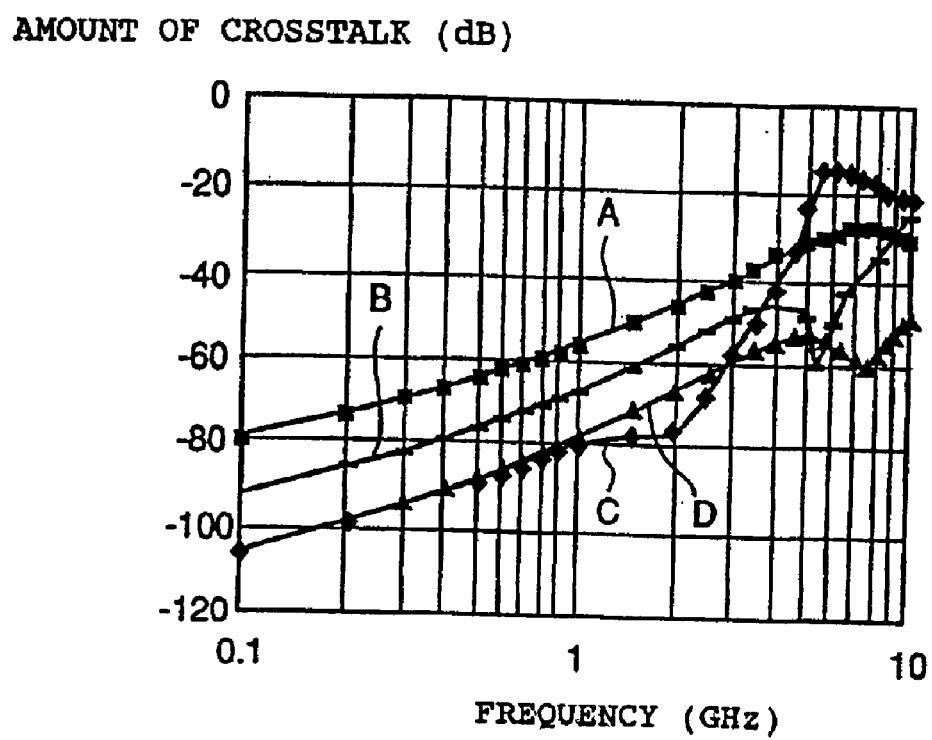
FIG. 14 depicts a graph showing the results of simulations that examined the effects obtained by the configurations of the fourth and fifth embodiments.

FIG. 14 depicts a graph illustrating the results of simulations done by the inventor. In the simulations, it was examined how the relationship between the amount of crosstalk from the light emitting device 2 side to the photodetector 3 side and frequencies of the electrical signals of the lead terminal 14a for inputting transmit signals is varied according to the forms of ground lead terminals 14c and 14d. A curve A shown in FIG. 14 is in the case of the proposed example. A curve B is in the case where the tip end parts of the ground lead terminals 14c and 14d are approximately an L-shape (fourth embodiment). A curve C is in the case where the tip end parts of the ground lead terminals 14c and 14d are approximately a U-shape and are grounded on one side (the form in FIG. 12; the fifth embodiment). A curve D is in the case where the tip end parts of the ground lead terminals 14c and 14d are approximately a U-shape and are grounded on both sides (the form in FIG. 13; the fifth embodiment).

As shown in FIG. 14, it can be confirmed that the fourth and fifth embodiments can reduce the amount of crosstalk as compared with the proposed example. Additionally, it is revealed that the fifth embodiment can reduce the amount of crosstalk more than the fourth embodiment. However, when the ground lead terminals 14c and 14d have approximately a U-shape and are grounded only on one side, the other end side (open end side) is floated from the ground as described above. On this account, when the frequency of the electrical signals of the lead terminal 14a for inputting transmit signals becomes high, the electric field is generated from the ground lead terminals 14c and 14d to increase the crosstalk from the lead terminal 14a for inputting transmit signals to the lead terminal 14b for outputting received signals. However, FIG. 14 also reveals that such the increase in crosstalk can be suppressed by grounding the both ends of the ground lead terminals 14c and 14d.

Furthermore, the form according to the configuration (β) is not limited to each form of the fourth and fifth embodiments, which can adopt various forms. For example, the arranged positions of the lead terminal 14a for inputting transmit signals or lead terminal 14b for outputting received signals are not limited to the positions shown in both the fourth and fifth embodiments. For instance, the first, third or fourth lead terminal 14 from the sidewall 15c side may be functioned as the lead terminal 14a for inputting transmit signals or lead terminal 14b for outputting received signals. In this manner, the arranged positions of the lead terminal 14a for inputting transmit signals or lead terminal 14b for outputting received signals are properly set in consideration of the device mounting substrate 4 or the wiring patterns formed on the bottom wall 12. Moreover, both the fourth and fifth embodiments showed the examples where four lead terminals 14 were disposed in each of the sidewalls 15a and 15b facing each other. However, the number of the lead terminals 14 is not defined as long as it is plural.

Figure 15:
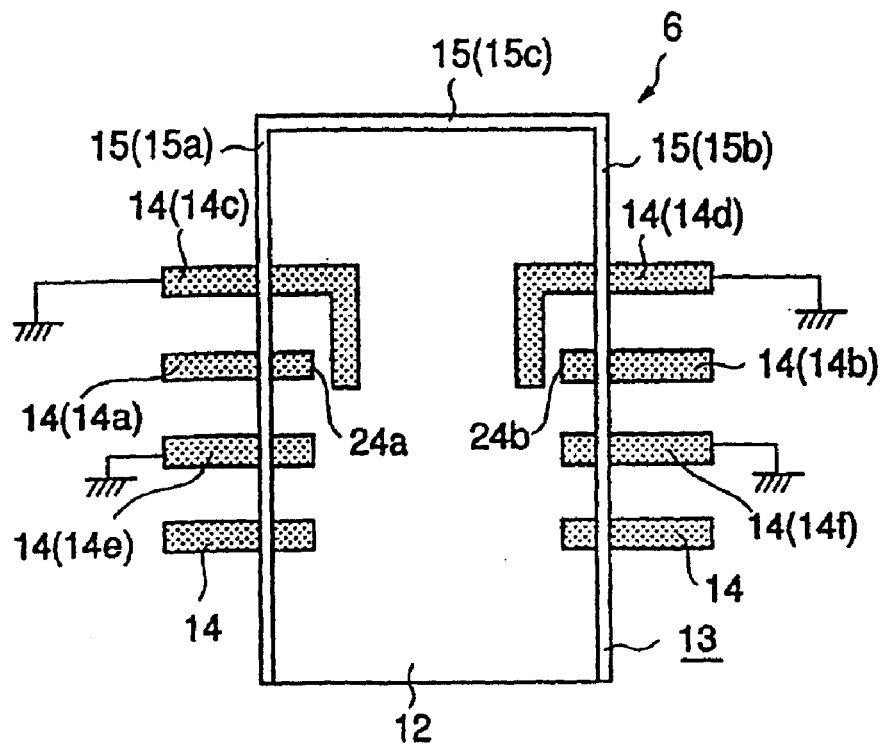
FIG. 15 depicts a model diagram showing a modified example of the lead frame depicted in the fourth embodiment.

Besides, in the fourth embodiment, the lead terminal 14c adjacent to one side of the lead terminal 14a for inputting transmit signals was configured to function as the ground lead terminal. However, as shown in FIG. 15, the lead terminals adjacent to both sides of the lead terminal 14a for inputting transmit signals may be functioned as the ground lead terminals 14c and 14e. In this case, for example, one of the ground lead terminals 14c and 14e may be formed into approximately an L-shape to interrupt between the tip end 24a of the lead terminal 14a for inputting transmit signals inside the enclosure and the tip end 24b of the lead terminal 14b for outputting received signals inside the enclosure.

Additionally, in the fourth embodiment, the lead terminal 14d adjacent to one side of the lead terminal 14b for outputting received signals was similarly configured to function as the ground lead terminal. However, the lead terminals 14 adjacent to both sides of the lead terminal 14b for outputting received signals may be functioned as the ground lead terminals 14d and 14f. In this case, one of the ground lead terminals 14d and 14f may be formed into approximately an L-shaped to interrupt between the tip end 24a of the lead terminal 14a for inputting transmit signals inside the enclosure and the tip end 24b of the lead terminal 14b for outputting received signals inside the enclosure.

Furthermore, in the fourth embodiment, the lead terminals 14 adjacent to the lead terminal 14a for inputting transmit signals and the lead terminal 14b for outputting received signals, respectively, were allowed to function as the ground lead terminals 14c and 14d, and the ground lead terminals 14c and 14d were formed into approximately an L-shape. However, for example, the lead terminals 14 not adjacent to the lead terminal 14a for inputting transmit signals and the lead terminal 14b for outputting received signals may be functioned as the ground lead terminals to form into approximately an L-shape. For instance, when the second lead terminal 14 from the sidewall 15c side is set to be the lead terminal 14a for inputting transmit signals, the fourth lead terminal 14 from the sidewall 15c side may be functioned as the ground lead terminal 14c and the tip end part of the ground lead terminal 14c may be extended to form the shape that interrupts between the tip end 24a of the lead terminal 14a for inputting transmit signals inside the enclosure and the tip end 24b of the lead terminal 14b for outputting received signals inside the enclosure.

Moreover, in the fourth embodiment, the ground lead terminals 14c and 14d had approximately an L-shape. However, the shape of the ground lead terminals 14c and 14d is not limited to approximately an L-shape. For example, it may be an elbowed shape or hook shape; a proper shape can be adopted. Besides, in each of the fourth or fifth embodiment, the ground lead terminals 14c and 14d were a bent shape having corners, but they may be a curved shape not having corners.

Figure 16:
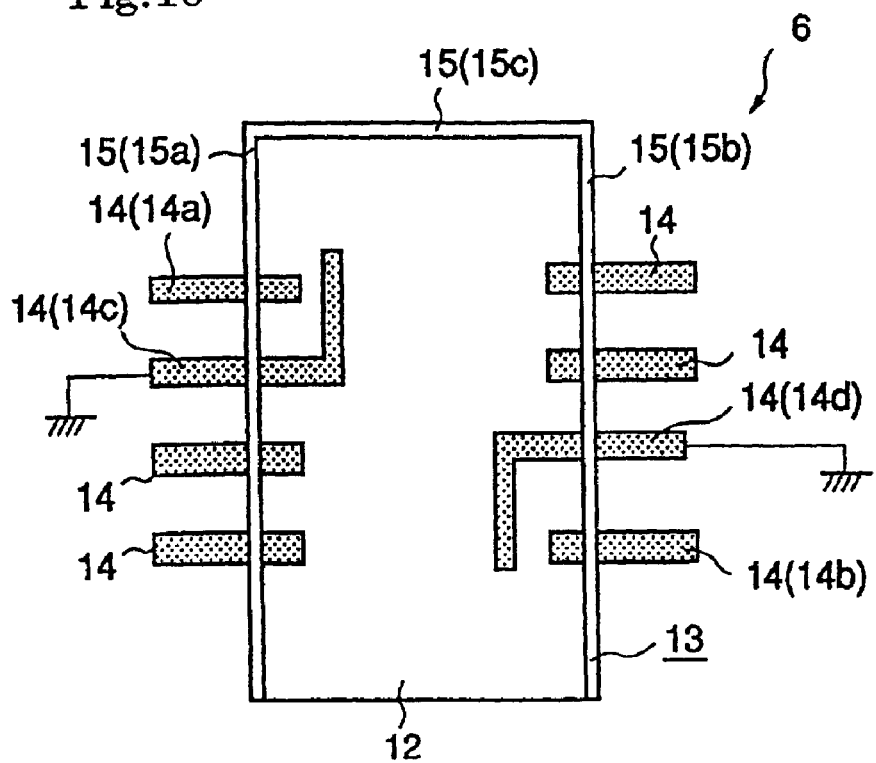
FIG. 16 depicts a model diagram showing another modified example of the lead frame depicted in the fourth embodiment.

Additionally, in each of the fourth or fifth embodiment, the lead terminal 14a for inputting transmit signals and the lead terminal 14b for outputting received signals were disposed in the positional relationship where the tip ends are faced each other. However, as shown in FIG. 16, the lead terminal 14a for inputting transmit signals and the lead terminal 14b for outputting received signals may be disposed in the positional relationship where the tip ends are not faced each other. Furthermore, in the example shown in FIG. 16, the ground lead terminals 14c and 14d adjacent to the lead terminal 14a for inputting transmit signals and the lead terminal 14b for outputting received signals, respectively, had the tip end part thereof approximately L-shaped. However, the shape of the tip end parts of the ground lead terminals 14c and 14d may of course have the form shown in the fifth embodiment.

When the lead terminal 14a for inputting transmit signals and the lead terminal 14b for outputting received signals have the positional relationship where the tip ends are not faced each other, the electric field is hardly generated between the lead terminal 14a for inputting transmit signals and the lead terminal 14b for outputting received signals. In addition to this, the tip end parts of the ground lead terminals 14c and 14d interrupt between the tip ends of the lead terminal 14a for inputting transmit signals and the lead terminal 14b for outputting received signals, whereby the reduction in the amount of crosstalk from the lead terminal 14a for inputting transmit signals to the lead terminal 14b for outputting received signals can be intended further surely.

Additionally, in each of the fourth and fifth embodiments, the ground lead terminal 14 having the shape shown in the fourth or fifth embodiment was disposed in both the sidewalls 15a and 15b. However, the ground lead terminal 14 having the shape shown in the fourth or fifth embodiment may be disposed only in one of the sidewalls 15a and 15b making a pair. Also in this case, the tip end parts (ground) of the ground lead terminals 14 are to be arranged so as to interrupt between the tip end 24a of the lead terminal 14a for inputting transmit signals inside the enclosure and the tip end 24b of the lead terminal 14b for outputting received signals inside the enclosure. On this account, the adverse effect of the electric field on the lead terminal 14b for outputting received signals by the lead terminal 14a for inputting transmit signals is prevented, and the crosstalk from the lead terminal 14a for inputting transmit signals to the lead terminal 14b for outputting received signals can be suppressed.

Figure 17A:
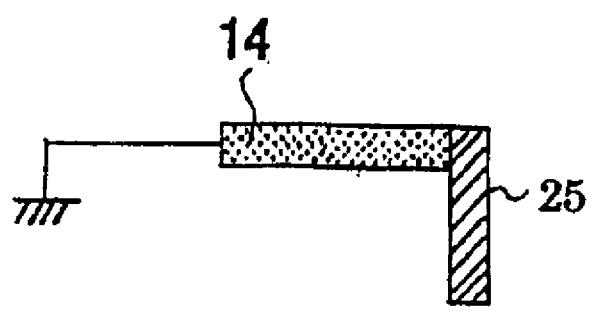
FIG. 17A depicts a model diagram showing another exemplary form of the ground lead terminal depicted in the fourth embodiment.
Figure 17B:
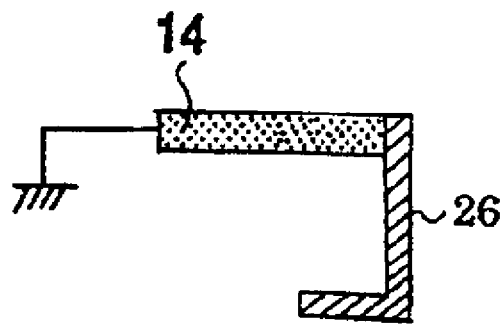
FIG. 17B depicts a model diagram showing another exemplary form of the ground lead terminal depicted in the fifth embodiment.

Furthermore, in the fourth embodiment, the ground lead terminals 14 (14c and 14d) having approximately an L-shape were disposed. However, as shown in FIG. 17A, for example, a conductor member 25 may be electrically connected to the tip end part of the straight ground lead terminal 14 to similarly be functioned as the ground lead terminals 14 (14c and 14d) having approximately an L-shape. Moreover, as shown in FIG. 17B, a conductor member 26 having approximately an L-shape may also be electrically connected to the tip end part of the straight ground lead terminal 14 (14c and 14d) to similarly be functioned as the ground lead terminals 14 (14c and 14d) having approximately a U-shape that were shown in the fifth embodiment. When the form shown in FIG. 17A or 17B is adopted, the same effect as the fourth or fifth embodiment can also be exerted. Besides, as shown in FIGS. 17A and 17B, there are various manners of electrically connecting the conductor member to the tip end part of the ground led terminal 14. When the example is named, there is the manner of joining them by utilizing solder or by welding.

Additionally, each of the fourth and fifth embodiments showed the example where the optical fiber module 1 is mounted with the single light emitting device 2 and the single photodetector 3, but it may be configured to dispose an arrayed light emitting device and an arrayed photodetector. In this case, disposed are a plurality of lead terminals 14a for inputting transmit signals corresponding to each of light emitting devices configuring the arrayed light emitting device one on one, and a plurality of lead terminals 14b for outputting received signals corresponding to each of photodetectors configuring the arrayed photodetector one on one. Also in this case, the ground lead terminals 14 are disposed, which have the shape for interrupting between the tip end of the plurality of lead terminals 14a for inputting transmit signals inside the enclosure and the tip end of the plurality of lead terminals 14b for outputting received signals, as shown in each of the fourth and fifth embodiments. Accordingly, the same effect as the fourth or fifth embodiment can be exerted.

Hereafter, a sixth embodiment will be described. In the sixth embodiment, an exemplary form according to the configuration (γ) will be described.

Figure 18:
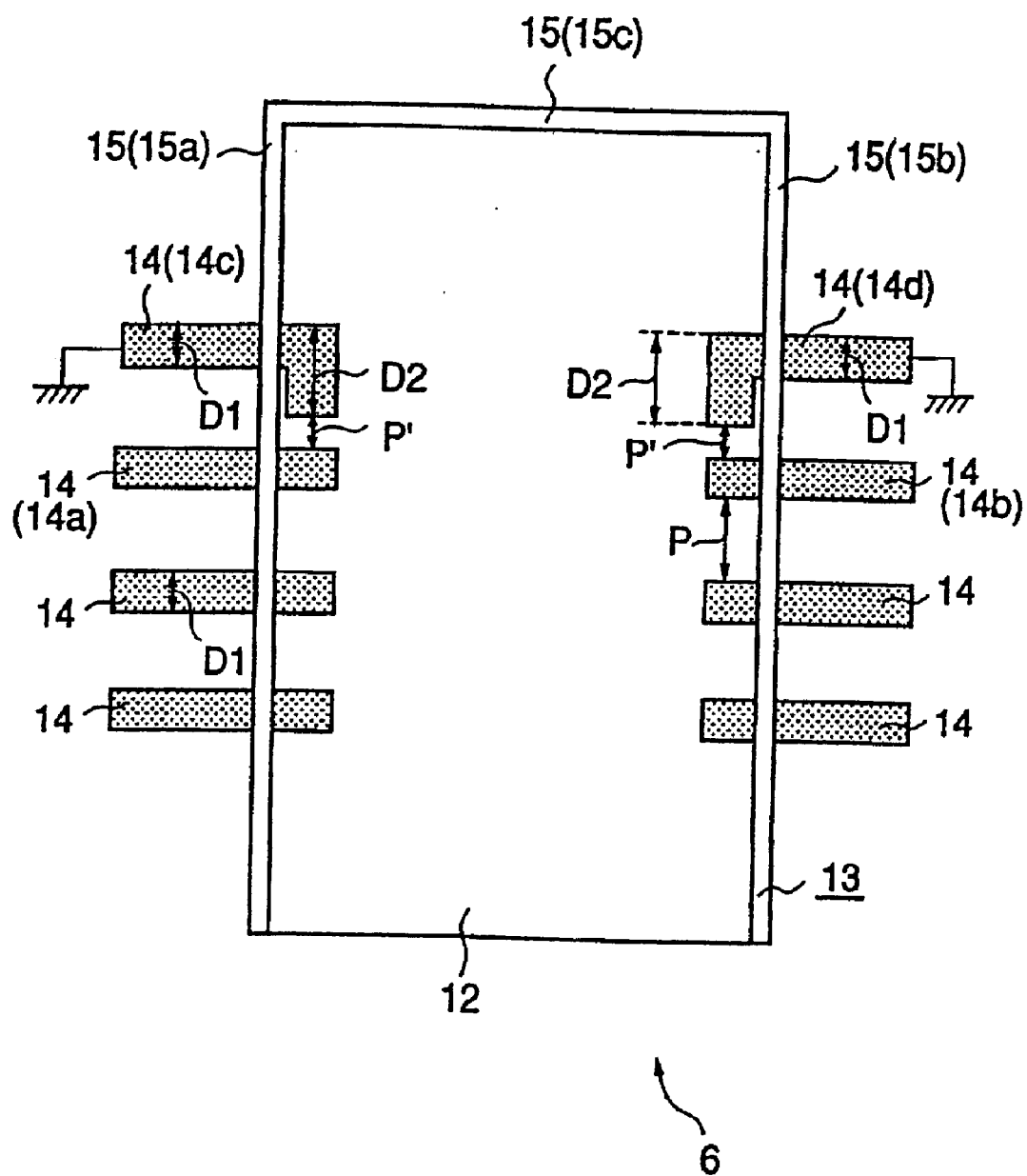
FIG. 18 depicts a diagram for illustrating a sixth embodiment.

FIG. 18 schematically depicts the lead frame configuring the optical fiber module of the sixth embodiment. The sixth embodiment is characterized by the arranged positions and shape of the ground lead terminals 14c and 14d. The other configurations are almost the same as the proposed example. Additionally, in the description of the sixth embodiment, the same components as the proposed example are designated the same numerals and signs, omitting the overlapping description of the common portions.

In the sixth embodiment, one of a plurality of lead terminals 14 in the sidewall 15a functions as the lead terminal 14a for inputting transmit signals, and one of a plurality of lead terminals 14 in the sidewall 15b facing the sidewall 15a functions as the lead terminal 14b for outputting received signals. The lead terminal 14c adjacent to the lead terminal 14a for inputting transmit signals and the lead terminal 14d adjacent to the lead terminal 14b for outputting received signals are allowed to function as the ground terminals. Besides, the tip end portions of the ground lead terminals 14c and 14d inside the enclosure are extended toward the adjacent lead terminal 14a for inputting transmit signals or the adjacent lead terminal 14b for outputting received signals and are formed wide in width.

Accordingly, an interval P' between the lead terminal 14a for inputting transmit signals and the ground lead terminal 14c, and an interval P' between the lead terminal 14b for outputting received signal and the ground lead terminal 14d are narrower than a pitch P for traditional lead terminal arrangement. For example, supposing a width D1 of the lead terminal 14 is about 600 μm and a pitch P between the adjacent ground lead terminals 14 is about 1200 μm. In this case, the inner tip end portions of the ground lead terminals 14c and 14d are extended in the direction close to the adjacent lead terminal 14a for inputting transmit signals or the adjacent lead terminal 14b for outputting received signals, and a width D2 of the wide portion is set about 1400 μm. Thus, the interval P' between the lead terminal 14a for inputting transmit signals and the ground lead terminal 14c and the interval P' between the lead terminal 14b for outputting received signals and the ground lead terminal 14d are narrowed about 400 μm.

Additionally, in this example, the distance between the lead terminal 14a for inputting transmit signals and the ground lead terminal 14c and the distance between the lead terminal 14b for outputting received signals and the ground lead terminal 14d were almost equal, but the distances may of course be varied.

In the sixth embodiment, the lead terminal 14c adjacent to the lead terminal 14a for inputting transmit signals and the lead terminal 14d adjacent to the lead terminal 14b for outputting received signals are allowed to function as the ground lead terminals. Also, it had the configuration of narrowing the distance between the lead terminal 14a for inputting transmit signals and the lead terminal 14c and the distance between the lead terminal 14b for outputting received signals and the lead terminal 14d. According to this configuration, the electric field of the lead terminal 14a for inputting transmit signals or lead terminal 14b for outputting received signals is turned into a state of being drawn to the adjacent ground lead terminal 14c or 14d. More specifically, the ground lead terminals 14c and 14d significantly exert the effect of suppressing the electric field. Therefore, the electric field between the tip ends of the lead terminal 14a for inputting transmit signals and the lead terminal 14b for outputting received signals can be suppressed.

Accordingly, the amount of crosstalk from the lead terminal 14a for inputting transmit signals to the lead terminal 14b for outputting received signals (the light emitting device 2 side to the photodetector 3 side) can be reduced.

Particularly, it is significantly effective in the following optical fiber module. The optical fiber module is that the high sensitivity of −20 dBm or greater is required as the minimum receiving sensitivity of the photodetector 3, electrical drive signals (drive current) fed to the light emitting device 2 is 5 mA or greater, and a distance between the center of emitting light of the light emitting device 2 and the center of receiving light of the photodetector 3 is one mm or under.

Additionally, the sixth embodiment only has the configuration in which the lead terminal 14c adjacent to the lead terminal 14a for inputting transmit signals and the lead terminal 14d adjacent to the lead terminal 14b for outputting received signals are allowed to function as the ground lead terminals, and the tip end portions of the ground lead terminals 14c and 14d inside the enclosure are simply formed wide in width. On this account, complex work, a rise in material cost, or an increase in the fabrication processes can be suppressed for fabrication. Furthermore, the lead frame 6 (optical fiber module 1) does not need to be scaled up for reducing the amount of crosstalk from the lead terminal 14a for inputting transmit signals to the lead terminal 14b for outputting received signals. Accordingly, the low-cost, small-sized optical fiber module 1 and lead frame 6 capable of suppressing the amount of crosstalk can be provided.

Hereafter, a seventh embodiment will be described. The seventh embodiment will show another exemplary form according to the configuration (γ). Additionally, in the description of the seventh embodiment, the same components as the sixth embodiment are designated the same numerals and signs, omitting the overlapping description of the common portions.

Figure 19:
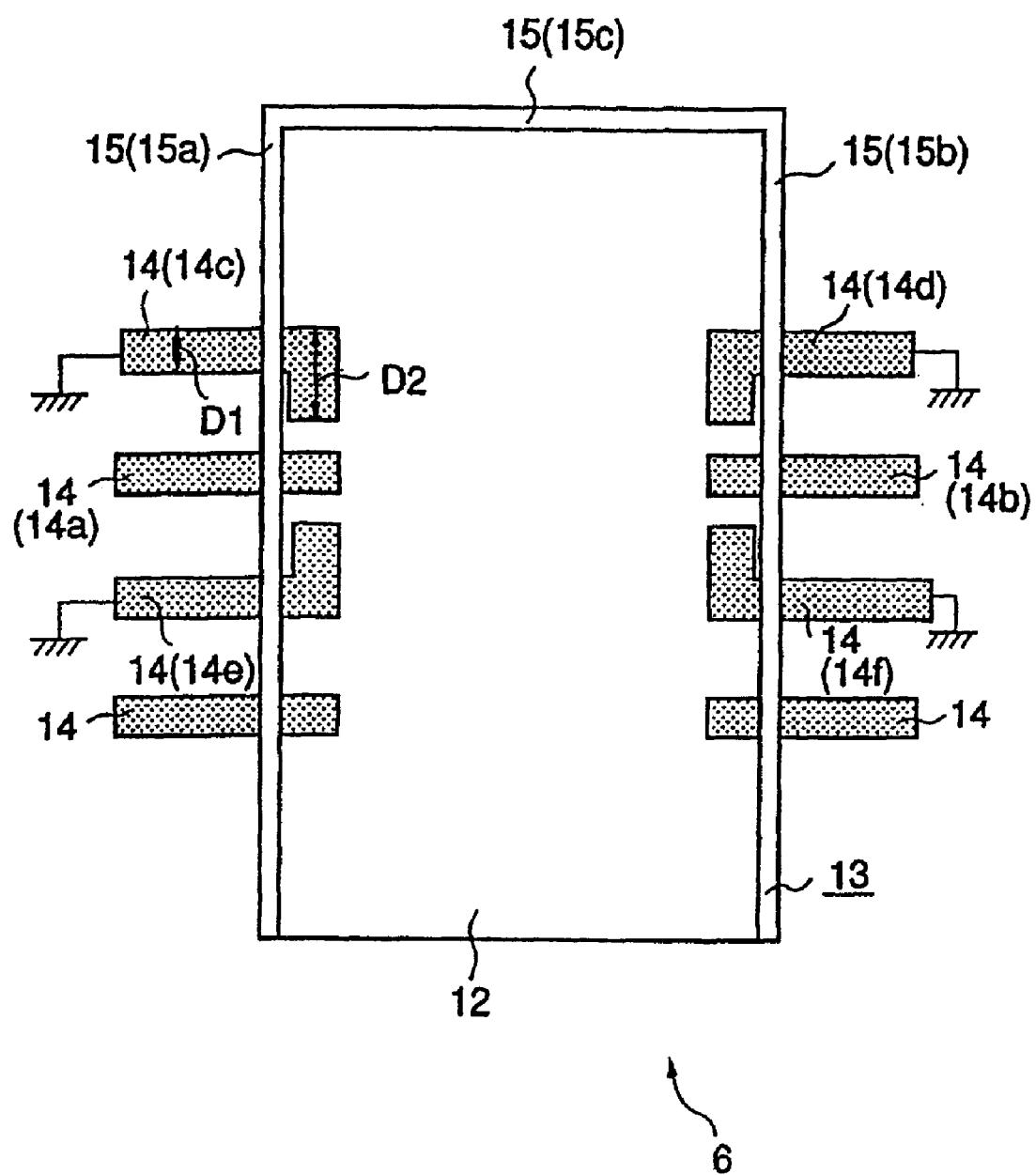
FIG. 19 depicts a diagram for illustrating a seventh embodiment.

In the seventh embodiment, as shown in FIG. 19, the lead terminal 14a for inputting transmit signals and the lead terminal 14b for outputting received signals are disposed with other lead terminals 14 on both sides thereof. The lead terminals 14c, 14d, 14e and 14f on both sides function as the ground lead terminals.

As similar to the sixth embodiment, the tip end portions of the ground lead terminals 14c, 14d, 14e and 14f inside the enclosure are extended toward the adjacent lead terminal 14a for inputting transmit signals or the adjacent lead terminal 14b for outputting received signals and are formed wide in width. For example, when a width D1 of the ground lead terminals 14c, 14d, 14e and 14f is about 600 μm, a width D2 of the tip end portion inside the enclosure is set about 1400 μm.

Thus, the distance between the lead terminal 14a for inputting transmit signals and the ground lead terminals 14c and 14e and the distance between the lead terminal 14a for inputting transmit signals and the ground lead terminals 14d and 14f are narrowed.

In the seventh embodiment, the ground lead terminals 14c and 14e were disposed on both sides of the lead terminal 14a for inputting transmit signals, and the ground lead terminals 14d and 14f were disposed on both sides of the lead terminal 14b for outputting received signals. Also, the distance between the ground lead terminals 14 (14c, 14d, 14e and 14f) and the lead terminal 14a for inputting transmit signals or lead terminal 14b for outputting received signals was narrowed. Therefore, the ground lead terminals 14 on both sides can suppress the electric field caused by the electrical signals of the lead terminal 14a for inputting transmit signals and the electric field caused by the lead terminal 14b for outputting received signals more effectively than the sixth embodiment. Accordingly, the amount of crosstalk from the lead terminal 14a for inputting transmit signals to the lead terminal 14b for outputting received signals (from the light emitting device 2 side to the photodetector 3 side) can be reduced much more.

Additionally, also in the seventh embodiment, the optical fiber module can be fabricated with complex work, a rise in material cost, or an increase in the fabrication processes suppressed, as similar to the sixth embodiment. Furthermore, the amount of crosstalk can be reduced with no scheme of scaling up the lead frame 6 (optical fiber module 1). More specifically, the low-cost, small-sized optical fiber module 1 and lead frame 6 capable of suppressing crosstalk can be provided.

Figure 20:
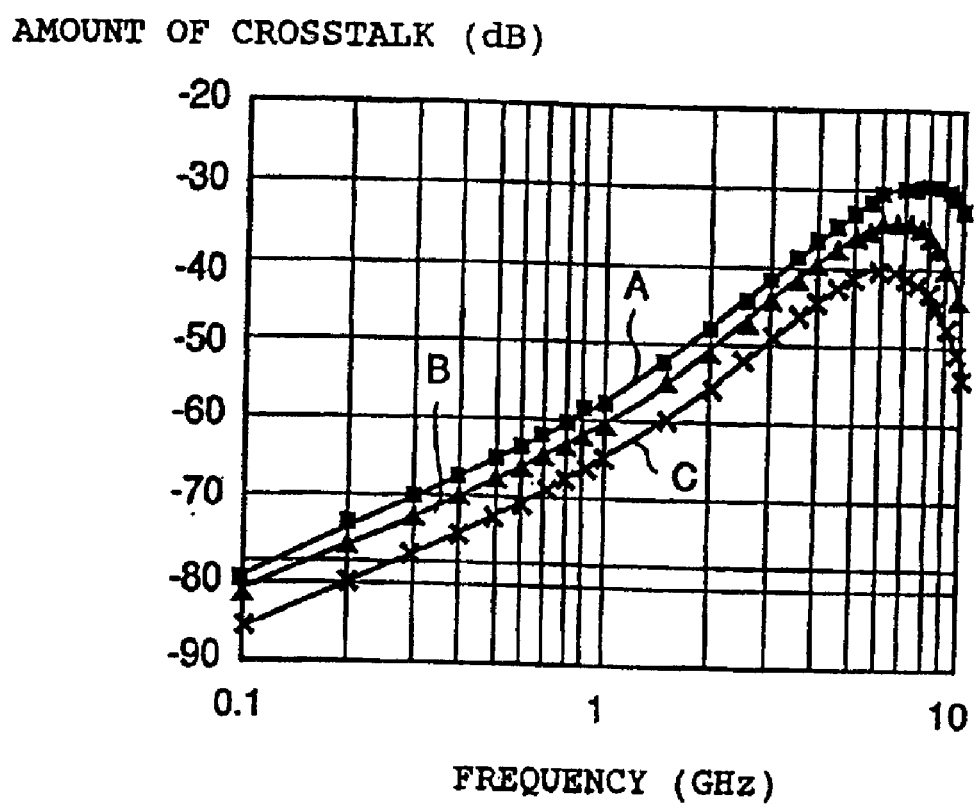
FIG. 20 depicts a graph showing the results of simulations that examined the effects obtained by the configurations of the sixth and seventh embodiments.

Meanwhile, the inventor has confirmed the effect of reducing the amount of crosstalk obtained by the configurations of the sixth and seventh embodiments according to the results of simulations. FIG. 20 depicts a graph illustrating the results of simulations. In the simulations, it was examined how the relationship between frequencies of high frequency electrical signals carried through the lead terminal 14a for inputting transmit signals and the amount of crosstalk from the light emitting device 2 side to the photodetector 3 side is varied according to the arranged positions and shape of the ground lead terminals 14. A curve A in FIG. 20 is in the case where the ground lead terminal 14 was adjacently disposed on one side of the lead terminal 14a for inputting transmit signals and on one side of photodetector 14b, but the distance between the ground lead terminal 14 and the lead terminal 14a for inputting transmit signals or lead terminal 14b for outputting received signals was the same as the pitch P of traditional arrangement. A curve B is in the case of the form shown in the sixth embodiment. A curve C is in the case of the form shown in the seventh embodiment.

The results of simulations reveal that the amount of crosstalk from the light emitting device 2 side to the photodetector 3 side can be reduced by narrowing the distance between the ground lead terminal 14 and the lead terminal 14a for inputting transmit signals or lead terminal 14b for outputting received signals as shown in the sixth or seventh embodiment (see the curves B and C), as compared with the case where the distance between the ground lead terminal 14 and the lead terminal 14a for inputting transmit signals or lead terminal 14b for outputting received signals is set as the traditional case (see the curve A).

Additionally, it is understood that the form in the seventh embodiment (see the curve C) can reduce the amount of crosstalk more than the form in the sixth embodiment (see the curve B). More specifically, it is revealed that the effect of suppressing the electric field by the lead terminals 14(seventh embodiment) where the lead terminals 14 on both sides are formed to be the ground lead terminals can much more reduce the amount of crosstalk than the effect of suppressing the electric field by the lead terminal 14 (sixth embodiment) where the lead terminal 14 only on one side of the lead terminal 14a for inputting transmit signals or on one side of the lead terminal 14b for outputting received signals is formed to be the ground lead terminal.

Figure 21:
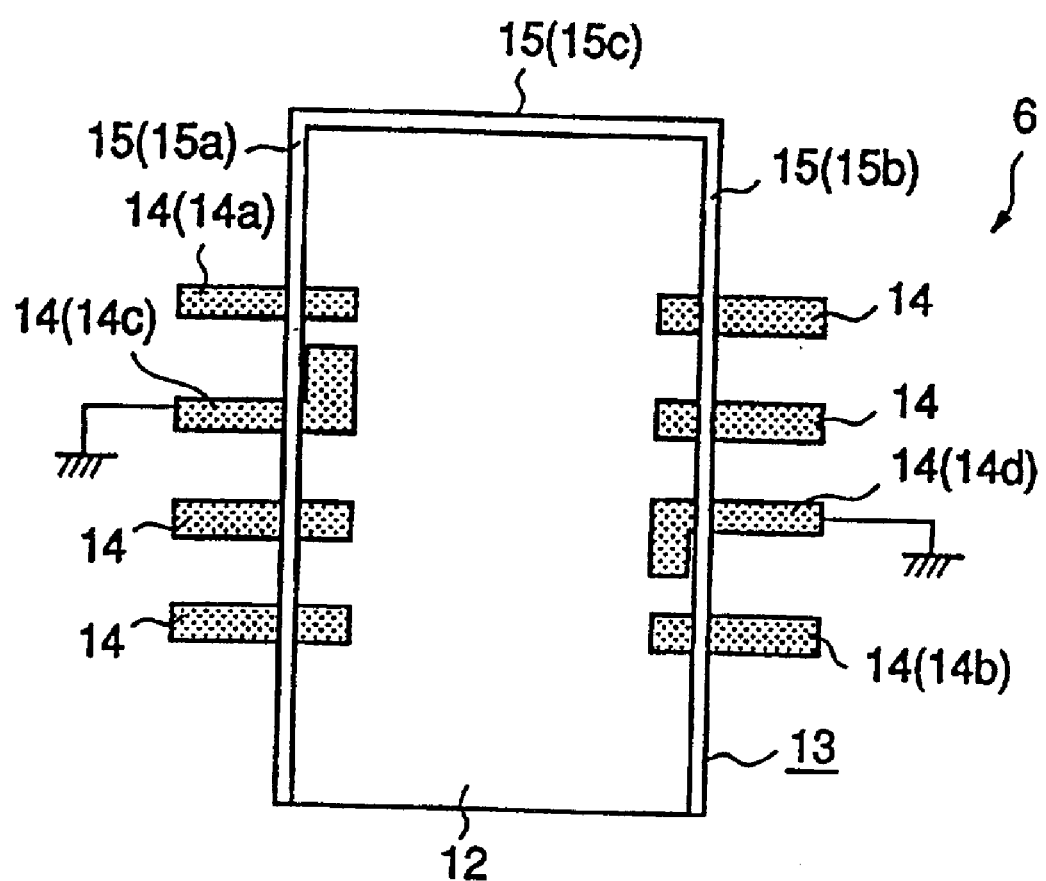
FIG. 21 depicts a diagram for illustrating a modified example of the sixth embodiment.

Furthermore, the forms according to the configuration (γ) are not limited to both the sixth and seventh embodiments, which can adopt various forms. For example, in each of the sixth and seventh embodiments, the lead terminal 14a for inputting transmit signals and the lead terminal 14b for outputting received signals had the positional relationship where the tip ends are faced each other. However, as shown in FIG. 21, for instance, the lead terminal 14a for inputting transmit signals and the lead terminal 14b for outputting received signals may have the positional relationship where the tip ends are not faced each other. In this case, the tip ends of the lead terminal 14a for inputting transmit signals and the lead terminal 14b for outputting received signals are not faced each other, and thus the electric field is hardly generated between the tip ends of the lead terminal 14a for inputting transmit signals and the lead terminal 14b for outputting received signals. In addition to this, the effect of suppressing the electric field by the ground lead terminals 14 as shown in each of the sixth and seventh embodiments can significantly reduce the amount of crosstalk from the lead terminal 14a for inputting transmit signals to the lead terminal 14b for outputting received signals (the light emitting device 2 side to the photodetector 3 side) more surely.

Moreover, in each of the sixth and seventh embodiments, four lead terminals 14 were disposed in both the sidewalls 15a and 15b of the enclosure 13. However, the number of the lead terminals 14 disposed is not defined as long as a plurality of lead terminals 14 is disposed in both the sidewalls 15a and 15b.

Besides, in each of the sixth and seventh embodiments, the ground lead terminals 14 having a wide width portion were adjacently arranged on both the lead terminal 14a for inputting transmit signals and the lead terminal 14b for outputting received signals. However, it may be configured in which only one of the lead terminal 14a for inputting transmit signals and the lead terminal 14b for outputting received signals has the ground lead terminal 14 adjacently on one side thereof as the sixth embodiment or adjacently on both sides as the seventh embodiment. In this case, it is preferable that the ground lead terminal having a wide width portion is arranged adjacent to the lead terminal 14a for inputting transmit signals as compared with being arranged adjacent to the lead terminal 14b for outputting received signals.

Additionally, each of the sixth and seventh embodiments showed the example where the optical fiber module 1 is mounted with the single light emitting device 2 and the single photodetector 3, but it may be configured to dispose an arrayed light emitting device and an arrayed photodetector. In this case, disposed are a plurality of lead terminals 14a for inputting transmit signals corresponding to each of light emitting devices forming the arrayed light emitting device one on one, and a plurality of lead terminals 14b for outputting received signals corresponding to each of photodetectors forming the arrayed photodetector one on one. Also in such the case, the ground lead terminals 14 are arranged adjacent to the plurality of lead terminals 14a for inputting transmit signals or plurality of lead terminals 14b for outputting received signals, as similar to each of the sixth and seventh embodiments, whereby the same effect as the sixth or seventh embodiment can be exerted.

What is claimed is:

1. An optical fiber module lead frame comprising:

an enclosure having a bottom wall and a plurality of sidewalls formed on the periphery of the bottom wall, said enclosure housing a light emitting device, a photodetector, and a wiring pattern for routing electrical signals within said enclosure;

at least a first lead terminal extending through a first one of said plurality of sidewalls for inputting electrical transmit signals into said enclosure that are converted to optical signals within said enclosure and transmitted by said light emitting device, said first lead terminal terminating inside said enclosure at a tip end and being electrically connected to said wiring pattern with a bonding wire internal to said enclosure; and at least a second lead terminal extending through a second one of said plurality of sidewalls different from said first one of said plurality of sidewalls for outputting received electrical signals that were converted from optical signals to electrical signals in said enclosure by said photodetector, said second lead terminal terminating inside said enclosure at a tip end and being electrically connected to said wiring pattern with a bonding wire internal to said enclosure;

wherein the lead terminal for inputting transmit signals and the lead terminal for outputting received signals are disposed so that their respective tip ends are not facing each other; and wherein a tip end part of at least one of the lead terminal for inputting transmit signals and the lead terminal for outputting received signals is bent along the bottom wall inside said enclosure so that an extended central line of the lead terminal for inputting transmit signals crosses an extended central line of the lead terminal for outputting received signals.

2. An optical fiber module comprising the lead frame according to claim 1.

3. An optical fiber module lead frame comprising:

an enclosure having a plurality of sidewalls and housing within said enclosure a light emitting device, a photodetector, and a wiring pattern for routing electrical signals within said enclosure;

at least a first lead terminal extending through a first one of said plurality of sidewalls for inputting electrical transmit signals into said enclosure that are converted to optical signals within said enclosure and transmitted by said light emitting device, said first lead terminal terminating inside said enclosure at a tip end and being electrically connected to said wiring pattern with a bonding wire internal to said enclosure;

at least a second lead terminal extending through a second one of said plurality of sidewalls different from said first one of said plurality of sidewalls for outputting received electrical signals that were converted from optical signals to electrical signals in said enclosure by said photodetector, said second lead terminal terminating inside said enclosure at a tip end and being electrically connected to said wiring pattern with a bonding wire internal to said enclosure; and at least one ground lead terminal extending through one of said first or second one of said plurality of sidewalls and disposed adjacent to one of the lead terminal for inputting transmit signals and the lead terminal for outputting received signals, said ground lead terminal terminating at a tip end inside said enclosure, wherein the tip end of the at least one ground lead terminal has a portion lying between said tip end parts of the lead terminal for inputting transmit signals and the lead terminal for outputting received signals.

4. The optical fiber module lead frame according to claim 3, wherein the ground lead terminal is formed into a shape that encloses the tip end part of the lead terminal for inputting transmit signals or the lead terminal for outputting received signals.

5. An optical fiber module comprising the lead frame according to claim 4.

6. An optical fiber module comprising the lead frame according to claim 3.

7. An optical fiber module lead frame comprising:

an enclosure having a plurality of sidewalls and housing within said enclosure a light emitting device, a photodetector, and a wiring pattern for routing electrical signals within said enclosure;

at least a first lead terminal extending through a first one of said plurality of sidewalls for inputting electrical transmit signals into said enclosure that are converted to optical signals within said enclosure and transmitted by said light emitting device, said first lead terminal terminating inside said enclosure at a tip end and being electrically connected to said wiring pattern with a bonding wire internal to said enclosure;

at least a second lead terminal extending through a second one of said plurality of sidewalls different from said first one of said plurality of sidewalls for outputting received electrical signals that were converted from optical signals to electrical signals in said enclosure by said photodetector, said second lead terminal terminating inside said enclosure at a tip end and being electrically connected to said wiring pattern with a bonding wire internal to said enclosure; and at least one ground lead terminal extending through one of said first or second one of said plurality of sidewalls and disposed adjacent to one of the lead terminal for inputting transmit signals and the lead terminal for outputting received signals, said ground lead terminal terminating at a tip end inside said enclosure, wherein the lead terminal for inputting transmit signals and the lead terminal for outputting received signals are disposed so as not to be adjacently disposed, and the tip end inside said enclosure of any one of the lead terminal for inputting transmit signals, the lead terminal for outputting received signals and the ground terminal is formed to extend in a direction close to a lead terminal adjacent thereto.

8. The optical fiber module lead frame according to claim 7, wherein a closest distance between the lead terminal extendedly formed and the lead terminal adjacent thereto is 500 $\mu$m or under.

9. An optical fiber module comprising the lead frame according to claim 8.

10. An optical fiber module comprising the lead frame according to claim 7.

* * * * *